(12) United States Patent
Menezo et al.

(10) Patent No.: US 10,476,231 B2
(45) Date of Patent: Nov. 12, 2019

(54) PHOTONIC DEVICE COMPRISING A LASER OPTICALLY CONNECTED TO A SILICON WAVEGUIDE AND METHOD FOR MANUFACTURING SUCH A PHOTONIC DEVICE

(71) Applicant: COMMISSARIAT À L'ÉNERGIE ATOMIQUE ET AUX ÉNERGIES ALTERNATIVES, Paris (FR)

(72) Inventors: Sylvie Menezo, Grenoble (FR); Torrey Thiessen, Toronto (CA)

(73) Assignee: COMMISSARIAT À L'ÉNERGIE ATOMIQUE ET AUX ÉNERGIES ALTERNATIVES, Paris (FR)

(*) Notice: Subject to any disclaimer, the term of this patent is extended or adjusted under 35 U.S.C. 154(b) by 0 days.

(21) Appl. No.: 16/291,102

(22) Filed: Mar. 4, 2019

(65) Prior Publication Data
US 2019/0280461 A1  Sep. 12, 2019

(30) Foreign Application Priority Data
Mar. 12, 2018 (FR) .................. 18 52120

(51) Int. Cl.
*G02B 6/12* (2006.01)
*G02B 6/13* (2006.01)
(Continued)

(52) U.S. Cl.
CPC ........ *H01S 5/1032* (2013.01); *G02B 6/12004* (2013.01); *G02B 6/13* (2013.01);
(Continued)

(58) Field of Classification Search
CPC ...... H01S 5/1032; H01S 5/125; H01S 5/0422; G02B 6/13; G02B 6/12004; G02B 2006/12121
See application file for complete search history.

(56) References Cited

U.S. PATENT DOCUMENTS 7,873,089 B2 * 1/2011 Chen ................ H01S 5/12
372/102
9,941,664 B1 * 4/2018 Hahn ................ H01S 5/2054
(Continued)

FOREIGN PATENT DOCUMENTS

EP     2988378 A1    2/2016

OTHER PUBLICATIONS

French Search Report for Application No. FR1852120 dated Nov. 7, 2018.
(Continued)

*Primary Examiner* — John Bedtelyon
(74) *Attorney, Agent, or Firm* — Pearne & Gordon LLP

(57) ABSTRACT

A photonic device comprising: a support; an intermediate layer (; an optical guiding level including a waveguide and a first to a fifth waveguide section. The photonic device further includes a first dielectric layer covering the optical guiding level and a gain structure in contact with the first dielectric layer. The second and fourth waveguide sections and the first and second ends of the gain structure form a first and a second zone of optical transition between a laser hybrid waveguide, and respectively the first and the fifth waveguide sections. A pattern forming a Bragg grating is arranged over a first part of the thickness of the third waveguide section which is away from the gain structure.

18 Claims, 19 Drawing Sheets

(51) Int. Cl.
  *H01S 5/10* (2006.01)
  *H01S 5/042* (2006.01)
  *H01S 5/125* (2006.01)

(52) U.S. Cl.
  CPC ............ *H01S 5/0422* (2013.01); *H01S 5/125* (2013.01); *G02B 2006/12121* (2013.01)

(56) References Cited

U.S. PATENT DOCUMENTS

| | | | |
|---|---|---|---|
| 10,014,660 B2* | 7/2018 | Ferrotti | H01S 5/1237 |
| 2007/0133648 A1 | 6/2007 | Matsuda et al. | |
| 2015/0270684 A1 | 9/2015 | Suzuki et al. | |
| 2017/0317471 A1* | 11/2017 | Lor | G02B 6/124 |
| 2018/0212399 A1* | 7/2018 | Menezo | H01S 5/021 |
| 2018/0335566 A1 | 11/2018 | Menezo et al. | |
| 2019/0094467 A1 | 3/2019 | Hassan et al. | |

OTHER PUBLICATIONS

U.S. Appl. No. 16/202,682 entitled "Photonic Chip With Folding of Optical Path and Integrated Collimation Structure", filed Nov. 28, 2018.

U.S. Appl. No. 16/260,655 entitled "Photonic Chip With Integrated Collimation Structure", filed Jan. 29, 2019.

Duprez, Helene et al., Hybrid III-V on Silicon Laterally Coupled Distributed Feedback Laser Operating in the O-Band, IN: IEEE Photonics Technology Letters, Sep. 15, 2016, vol. 28, No. 18, pp. 1920-1923.

Keyvaninia, S. et al. "Heterogeneously integrated III-V/silicon distributed feedback lasers" IN: Optics Letters, Dec. 15, 2013, vol. 38, No. 24, pp. 5434-5437.

Orcutt, Jason et al. "Open foundry platform for high-performance electronic-photonic integration" IN: Optics Express, May 12, 2012, vol. 20, No. 11, pp. 12222-12232.

* cited by examiner

PHOTONIC DEVICE COMPRISING A LASER OPTICALLY CONNECTED TO A SILICON WAVEGUIDE AND METHOD FOR MANUFACTURING SUCH A PHOTONIC DEVICE

CROSS-REFERENCE TO RELATED APPLICATIONS

This application claims priority from French Patent Application No. 1852120 filed on Mar. 12, 2018. The content of this application is incorporated herein by reference in its entirety.

TECHNICAL FIELD

The invention relates to the field of optoelectronic and photonic devices.

More specifically, the subject matter of the invention is a photonic device comprising a waveguide intended to accommodate several silicon photonic components and a hybrid laser on silicon including a gain medium capable of emitting light.

PRIOR ART

The manufacture of hybrid photonic devices integrating silicon photonic components and at least one hybrid laser on silicon including a gain medium capable of emitting light, such as a gain medium made of III-V semiconductor materials, must necessarily take into account design constraints as regards the dimensioning of the first silicon waveguide accommodating the silicon photonic components and the second silicon waveguide entering into the composition of the hybrid laser. Such a hybrid laser generally includes:
  a gain structure comprising at least one gain medium capable of emitting light, the gain structure overlying a section of the second silicon waveguide to form therewith a hybrid waveguide,
  an optical feedback structure making it possible to form a resonant cavity including the gain medium of said gain structure,
  and optical transitions between the second silicon waveguide and the hybrid waveguide.

Above and in the remainder of this document "gain structure" is taken to mean a structure with semiconductor materials suited to provide a light emission being able notably to be stimulated in order to provide a laser type emission when such a structure is coupled to an optical feedback structure, such as a Bragg grating distributed along said gain structure. Such a gain structure comprises at least one gain medium, which is the material in which the emission of light is generated, and, on either side, a first and second zone each having a type of conductivity opposite to that of the other to allow an electrical pumping of the gain medium. In a conventional application of lasers with semiconductor materials, notably to provide an emission in the ranges of wavelengths of the infrared and in particular at the wavelengths of 1310 nm and 1550 nm, the first and second zones and the gain medium are formed by epitaxial growth on substrates made of indium phosphide InP or gallium arsenide GaAs. Indeed, the small lattice difference of these materials with their quaternary alloys make it possible to provide first and second zones and a gain medium of good crystalline quality ideal to optimise laser emission performance.

The gain medium of such a gain structure may comprise a succession of quantum wells providing the emission of light. In order to increase the confinement factor of the optic mode in the quantum wells, said wells are generally surrounded by two barrier layers. In an alternative to quantum wells, the gain medium may also comprise quantum dots. In order to form such quantum wells, or quantum boxes, and in a conventional configuration of such a hybrid laser, the gain medium may comprise at least two semiconductor materials selected for example from the group comprising indium phosphide InP, gallium arsenide GaAs, indium arsenide InAs, indium gallium arsenide phosphide InGaAsP, indium gallium aluminium arsenide InGaAlAs, aluminium gallium arsenide AlGaAs and indium arsenide phosphide InAsP and alloys thereof. In the same way, the first and the second zones may be made of at least one semiconductor material selected from the group comprising indium phosphide InP, gallium arsenide GaAs, indium gallium arsenide InGaAs, indium arsenide InAs, indium gallium arsenide phosphide InGaAsP, indium gallium aluminium arsenide InGaAlAs, indium aluminium arsenide nitride InGaAsN, aluminium gallium arsenide AlGaAs and indium arsenide phosphide InAsP and alloys thereof, one of the first and the second zones being of a first type of conductivity in which the majority carriers are electrons, the other being of a second type of conductivity in which the majority carriers are holes.

Such gain structures may be either of the "vertical" type or of the "lateral" type. In the first case, that is to say a gain structure of the "vertical" type, the first zone, the gain medium and the second zone are constituted by a stack of layers at the surface of a support. In such a configuration, the thickness of the stack forming the gain structure is generally comprised between 1 to 3 µm. In the second case, that is to say a gain structure of the "lateral" type, the first zone, the gain medium, and the second zone succeed each other in contact along a support. The typical thickness of a gain structure of the lateral type is of the order of 500 nm.

Above and in the remainder of this document "optical feedback structure" is taken to mean an optical structure produced in a waveguide and making it possible to form a guiding resonant cavity including the gain medium. Thus, the optical field goes back and forth in the waveguide of the cavity between the ends of this same resonant cavity, so doing to generate a stimulated emission of the gain medium.

Within the scope of the invention, the laser is a so-called distributed feedback (DFB) laser. In such a configuration, the optical feedback structure is constituted by a distributed reflector, such as a Bragg grating, under or in the gain structure, forming a wavelength selective mirror.

S. Keyvaninia and his co-authors described in their works published in 2013 in the scientific journal "Optics Letters", volume 38, number 24, pages 5434 to 5437, a photonic device comprising such a laser. As illustrated in FIG. 1a) of this document reproduced here by FIG. 1, this device comprises:
  a support 120,
  an intermediate layer 420 made of silicon dioxide SiO$_2$, the intermediate layer 420 being in contact with the support 120,
  a layer made of silicon material 201,
  a first waveguide 210 formed in the layer 201,
  first to fifth waveguide sections 211, 212, 213, 214, 215 formed in the layer 201, the first to the fifth waveguide sections 211, 212,213, 214, 215 succeeding each other while being optically connected two by two, and being optically connected to the first waveguide 210 by at least one of the first and the fifth waveguide sections 211, 215, a dielectric filling material 205 so as to form with the waveguide and the first to the fifth waveguide sections a wave guiding level 200 of the photonic device 1, a first dielectric layer 110, formed in this document by benzocyclobutene (better known as BCB), the first dielectric layer 110 covering the optical guiding level opposite to the intermediate layer 420, a gain structure 310 in contact with the first dielectric layer 110 and comprising at least one gain medium 321 capable of emitting light, the gain structure 310 having a central portion facing the third waveguide section 213 and a first and a second end facing second and fourth waveguide sections 212, 214, thus, the central portion of the gain structure 310 forms with the third waveguide section 213 a laser hybrid waveguide, the second and fourth waveguide sections 212, 214 and the first and second ends of the gain structure 310 forming a first and a second optical transition zone of an optic mode between the laser hybrid waveguide and respectively the first and the fifth waveguide sections 211, 215.

It has to be note that in this document, that, instead of the wording "laser hybrid waveguide" it could also be used a more usual wordings which is "hybrid laser waveguide" or "waveguide of an hybrid laser" without departing from the scope of invention.

In order to form a DFB laser, the third waveguide section includes an arranged pattern, said pattern forming a distributed Bragg grating 223 under the gain structure to form a feedback structure and a resonant cavity including at least one part of the gain medium 321. According to a conventional configuration, the Bragg grating 223 described in this document is constituted, as shown in FIG. 1, by an alternation of relatively wide transversal sections, designated wide ridges of width WL and of relatively narrow transversal section, designated narrow ridges of width WN less than WL, of the third waveguide section. In the configuration of the Bragg grating 223 represented in FIG. 1, the width WN is zero.

It should be noted that in the remainder of this document, a Bragg grating 223 of which the widths WN of the narrow ridges are zero is noted Bragg grating with vertical corrugation or patterning.

The pattern forming the Bragg grating is arranged in a part of the thickness of the third waveguide section 213 which is in contact with the dielectric layer 110.

With such a Bragg grating, it is possible to define a feedback force known as the Kappa force and noted $k_g$. This feedback force may be calculated, if wide and narrow ridges of same lengths are considered, from the following equation:

$$K_g = \frac{2(neff2 - neff1)}{\lambda} \quad (1)$$

With $\lambda$ the resonance wavelength of the resonant cavity, neff1 and neff2 the effective indices of the optic mode guided in the hybrid waveguide at the level s respectively of the wide ridges and narrow ridges (that is to say, the width WN being zero, the hollows in FIG. 1).

S. Keyvaninia and his co-authors have shown by the graph of FIG. 2 provided in their works, which is reproduced in FIG. 2, that the Kappa value increases when the thickness D of the first dielectric layer 110 decreases.

To perform their calculation, S. Keyvaninia and his co-authors used the following configuration: thickness of the silicon layer 201 of 400 nm, thickness of the first waveguide 210 of 220 nm, thickness of the second waveguide, of which the third waveguide section 213, of 400 nm and thickness of the ridges set for the first calculations (noted 400 nm/150 nm) at 250 nm, for the second calculations (noted 400 nm/180 nm) at 220 nm and for the third calculations (noted 400 nm/200 nm) at 200 nm.

The graph represented in FIG. 2 reports the Kappa calculation as a function of the thickness D for these three types of corrugation (thicknesses of ridges of 250 nm, 220 nm and 200 nm). The minimum Kappa value is thereby equal to 40 $cm^{-1}$, for a thickness of the intermediate layer 420 of 100 nm, and reaches nearly 200 $cm^{-1}$ for a thickness of 50 nm of this same layer and exceeds 400 $cm^{-1}$ for a thickness of 20 nm. The authors of this publication also show that it is possible to reduce the feedback force of the Bragg grating by modifying the volume ratio between the zones of the third waveguide section having wide ridges and those having narrow ridges, by modifying the thickness of the ridges, but this variation remains limited, as shown in FIG. 2.

Yet, this feedback force must be adapted as a function of the dimensioning of the gain structure 310. Indeed, for a correct operation of a laser comprising a gain structure having respectively a length of 500 µm and of 1000 µm, it is known that the feedback force must be comprised between respectively 20 and 40 $cm^{-1}$ and between 10 and 20 $cm^{-1}$. It will be noted that, more generally, the product Kappa by the length of the gain structure must be comprised between 1 and 2.

Thus, on account of these dimensioning constraints, it is not possible with the usual configuration of a photonic device, such as that proposed by S. Keyvaninia and his co-authors, to provide a DFB laser having both a gain structure with a considerable length and a relatively low thickness of the first dielectric layer 110, that is to say less than 100 nm.

H. Duprez and his co-authors, within the scope of their works published in 2016 in the scientific journal "IEEE Photonics Technology Letter", Volume 28, number 18, pages 1920 to 1923 have also made the same observations. In the photonic device described in their works, the configuration employed is the following: thickness of the silicon layer 201 of 500 nm, thickness of the first waveguide 210 of 300 nm, thickness of the second waveguide of 500 nm. The Bragg grating 223 is produced by patterning by alternation of wide ridges of width WL in turn equal to 770, 800, and 830 nm and narrow ridges of width in turn equal to 370 and 600 nm, the ridges being formed in a thickness of 200 nm of the silicon layer 20 which is in contact with the dielectric layer 110

It should be noted that in the remainder of this document, that such a configuration in which the Bragg grating 223 has a non-zero width WN of the narrow ridges is noted Bragg grating with lateral corrugation or pattern.

In the same way as for a vertical corrugation, it is possible to define for a lateral pattern a feedback force of the Bragg grating from equation (1).

It should be noted that the authors here impose choosing wide ridges having a width WL around 800 nm because, as is known by those skilled in the art, to minimise optical losses between the laser hybrid waveguide and the first and second optical transitions zones, for an active structure 310 of thickness of around 3 µm, and for the second, third and fourth waveguide sections 212, 213 and 214 of total thickness 500 nm, it is preferable to have a width WL of the wide ridges greater than around 800 nm. Hence, it is thus not possible to benefit from the variation in feedback forces of the Bragg grating, shown in FIG. 2 (see notably FIG. 2a) of the article of H. Duprez and his co-authors, which enables the reduction in the width WL of the wide ridges.

H. Duprez and his co-authors show that it is possible to reduce the feedback force of the Bragg grating by modifying the volume ratio between the wide ridges and the narrow ridges, by increasing the width of the narrow ridges. However, this variation remains limited, as shown by the comparison of FIGS. 2b and 2c of this document. Thus, even an optimisation of this ratio does not make it possible to provide a DFB laser having both a gain structure with a considerable length, that is to say greater than 50 µm, and a relatively low thickness of the first dielectric layer 110, that is to say less than 100 nm.

It will also be noted that the photonic device taught by H. Duprez and his co-authors has a feedback force having great variability in the width dispersions of the wide and narrow ridges.

In a similar way, the document EP 2988378 has an alternative configuration to such a photonic device, the device that it discloses has the same drawback and does not make it possible to end up with, for small thicknesses of the first dielectric layer separating the third waveguide section from the gain structure, a feedback force of the Bragg grating suited for lengths of gain structure greater than 50 µm.

Thus in existing devices and for thicknesses of a first dielectric layer less than 100 nm, the feedback force of the Bragg grating 223 cannot be adjusted to a sufficiently low value, even by modifying the volume ratio between the wide and narrow ridges.

DESCRIPTION OF THE INVENTION

The invention aims to overcome this drawback and thus has the aim of providing a photonic device capable of comprising a laser including a gain structure of a length greater than 50 µm, or even 500 µm, or instead 1000 µm, so doing with a first dielectric layer which, separating the gain structure from the third waveguide section in which is formed a distributed Bragg grating, has a thickness less than or equal to 120 nm or even 50 nm or instead 10 nm.

To this end, the invention relates to a photonic device comprising:
  a support,
  an intermediate layer in contact with the support comprising at least one dielectric material,
  a first waveguide,
  a first to a fifth waveguide section distinct from the first waveguide, the first to the fifth waveguide sections succeeding each other while being optically connected two by two, and being optically connected to the first waveguide by at least one of the first and of the fifth waveguide sections,
  a dielectric filling material, to form with the first waveguide and the first to the fifth waveguide sections a wave guiding level of the photonic device, the optical guiding level including a first face through which it is in contact with the intermediate layer and a second face opposite to the first face,
  a first dielectric layer comprising a dielectric material, the first dielectric layer covering the optical guiding level on its second face,
  a gain structure in contact with the first dielectric layer and comprising at least one gain medium capable of emitting light, the gain structure having a central portion facing the third waveguide section and a first and a second end facing the second and fourth waveguide sections, thus, the central portion of the gain structure forms with the third waveguide section a laser hybrid waveguide, the second and fourth waveguide sections and the first and second ends of the gain structure forming a first and a second zone of optical transition of an optic mode between the laser hybrid waveguide and respectively the first and the fifth waveguide sections,
  in which the third section is in contact with the intermediate layer and includes a pattern arranged uniquely in a first part of its thickness, said pattern forming a distributed Bragg grating under the gain structure to form a feedback structure and a resonant cavity including at least one part of the gain medium, so doing so as to form a laser optically connected to the waveguide by at least one of the first and the fifth waveguide sections,
  in which the second and fourth waveguide sections are in contact with the intermediate layer on a part of the intermediate layer which is constituted uniquely of dielectric materials.

The third waveguide section includes at least one second part of its thickness which separates the first dielectric layer and the first part of the thickness of the third waveguide section.

In such a photonic device, the arrangement of the pattern forming the Bragg grating over a first part of the thickness of the third waveguide section situated at a distance from the first dielectric layer, and thus at a distance from the gain structure, makes it possible to obtain a considerable reduction in the feedback force of the Bragg grating vis-à-vis the prior art. This reduction is sufficient to end up with a feedback force suited for gain structures of considerable length, that is to say greater than 50 µm, so doing even for first dielectric layers of low thickness, that is to say less than or equal to 100 nm.

It will also be noted that such an arrangement of the Bragg grating also makes it possible to make the Kappa value less sensitive to inhomogeneities of widths of the wide and narrow ridges.

The first part of the thickness of the third waveguide section may be in contact with the intermediate layer.

The third waveguide section may include at least one third part of its thickness, said third thickness part being in contact with the intermediate layer.

The thickness of the first dielectric layer may be less than or equal to 100 nm, the thickness of the first dielectric layer being preferentially less than or equal to 90 nm, or even 70 nm, or even 20 nm.

A device having such a first dielectric layer particularly benefits from the advantages of the invention, which is to provide a distributed Bragg grating being able to have a feedback force suited for such thicknesses of the first dielectric layer.

The third waveguide section may extend longitudinally along an optical propagation axis of the optical device, the pattern of the third section consisting in an alternation between a transversal section of a first width and a transversal section of a second width different from the first width.

The second width may be of zero value.

The gain structure may extend longitudinally along an optical propagation axis of the optical device, and each of the first and the second ends of the gain structure may have, over at least one part of its thickness and along a longitudinal direction moving away from the central portion, a transversal section of decreasing width.

Such a variation in section at the two ends, and over a part of the thickness, of the gain structure is particularly suited to a thickness of silicon layer 201 less than 700 nm, or less than 500 nm, and being able to be equal to 400 nm, or even 300 nm.

The gain structure may extend longitudinally along an optical propagation axis of the optical device and comprise a first semiconductor zone, a second semiconductor zone and the gain medium, and, for each of the first and the second ends of the gain structure, the first semiconductor zone, the second semiconductor zone and the gain medium may have, over their respective lengths, a transversal section of constant width.

Such a constant transversal section of the first semiconductor zone, the second semiconductor zone and the gain medium makes it possible to provide transition zones particularly suited to a thickness of silicon layer 201 greater than 500 nm, and for example equal to 700 nm.

The waveguide may accommodate at least one optical and/or electronic component, the optical component being preferentially chosen from the group comprising PN junction silicon optical modulators, hybrid III-V semiconductor on silicon modulators, surface coupling gratings, fibre couplers through the edge of the device, optical filters, wavelength multiplexers and demultiplexers, and photodetectors of which germanium on silicon photodetectors and III-V semiconductor on silicon photodetectors form part, and the electronic component preferentially being a transistor.

The component accommodated by the waveguide may be a hybrid III-V semiconductor on silicon modulator, said modulator being a capacitive modulator.

The invention also relates to a method for manufacturing a photonic device comprising at least one silicon waveguide and a laser including a gain medium capable of emitting light, the method comprising the following steps:

providing a substrate associated with at least one silicon layer on a first dielectric layer, forming, at least in part in the silicon layer, a first waveguide and first to fifth waveguide sections distinct from the first waveguide, the first to the fifth waveguide sections succeeding each other optically connected two by two, and being optically connected to the first waveguide by at least one of the first and the fifth waveguide sections, the third section including a pattern arranged uniquely over a first part of its thickness, said pattern forming a Bragg grating, burying the waveguide and the first to fifth waveguide sections by at least one dielectric filling material and planarization of said dielectric filling material in order to form an optical guiding level including the waveguide and the first to fifth waveguide sections and an intermediate layer in contact with said optical guiding level, the third section being in contact with the intermediate layer, the second and fourth waveguide sections being in contact with the intermediate layer on a part of the intermediate layer which is constituted uniquely of dielectric materials, a substrate/first dielectric layer/optical guiding level/intermediate layer assembly thereby being formed, providing a support, assembling the substrate/first dielectric layer/optical guiding level/intermediate layer assembly on the support, the assembly being carried out by bonding of the intermediate layer on the support, removing of the substrate, forming a gain structure comprising at least the gain medium, the gain structure being formed in contact with the first dielectric layer while having a central portion of the gain structure facing the third section and a first and a second end facing the second and the fourth sections, thus, the central portion of the gain structure forms with the third waveguide section a laser hybrid waveguide, the second and fourth waveguide sections, and the first and second ends of the gain structure forming a first and a second zone of optical transition of an optic mode between the laser hybrid waveguide and respectively the first and the fifth waveguide sections, the photonic device being thereby formed, during said formation of the structure, the first part of the thickness of the third section on which is arranged the pattern being separated from the first dielectric layer by at least one second part of the thickness of the third section.

Such a method enables the manufacture of a photonic device according to the invention and to benefit from the advantages that are linked thereto.

The step of forming, at least in part in the silicon layer, the first waveguide and the first to fifth waveguide sections distinct from the first waveguide may include the following sub-steps:

patterning the silicon layer to form a second thickness part of the waveguide and the first to fifth waveguide sections, forming from an additional silicon layer a first thickness part of the waveguide and the first to fifth waveguide sections.

A step of thinning the first dielectric layer may further be provided between the steps of removal of the substrate and forming the gain structure.

Such a thinning makes it possible to obtain a first dielectric layer having a thickness adapted to benefit as much as possible from the advantages of the invention.

After the step of thinning the first dielectric layer, the first dielectric layer may have a thickness less than or equal to 110 nm, the thickness of the first dielectric layer preferentially being less than or equal to 90 nm, or even 70 nm, or even 20 nm.

During the step of forming the gain structure, the gain structure may extend longitudinally along an optical propagation axis of the optical device and the first and the second ends of the gain structure may have, over at least one part of their thickness and along a longitudinal direction moving away from the central portion, a transversal section of decreasing width.

Such a step of forming the gain structure makes it possible to provide a gain structure particularly suited to a thickness of silicon layer less than 700 nm, or less than 500 nm, and being able to be equal to 400 nm, or even 300 nm.

During the step of forming the gain structure, the gain structure may extend longitudinally along an optical propagation axis of the optical device and may comprise a first semiconductor zone, a second semiconductor zone, and the gain medium, and, for each of the first and the second ends of the gain structure, the first semiconductor zone, the second semiconductor zone and the gain medium may have, over their respective lengths, a transversal section of constant width.

Such a step of forming the gain structure makes it possible to provide a gain structure particularly suited to a thickness of silicon layer greater than 500 nm, and for example equal to 700 nm.

BRIEF DESCRIPTION OF THE DRAWINGS

The present invention will be better understood on reading the description of exemplary embodiments, given for purely illustrative purposes and in no way limiting, while referring to the appended drawings in which.

Figure 1:
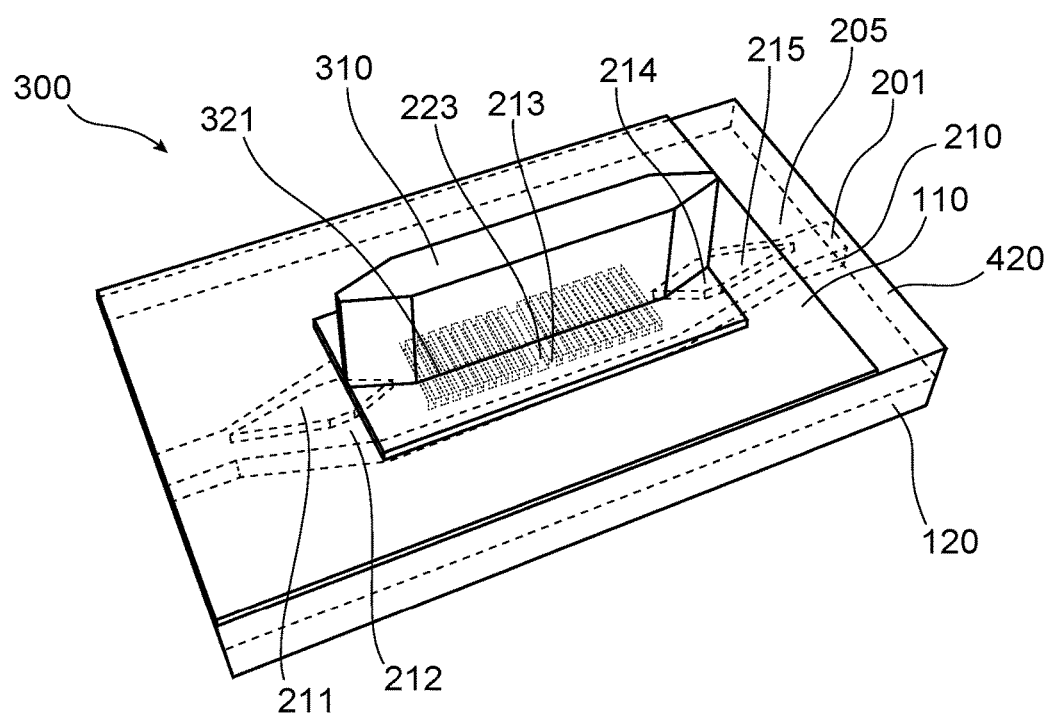
FIG. 1 illustrates a photonic device of the prior art extracted from the works of S. Keyvaninia et al. published in the scientific journal "Optics Letters" in 2013.
Figure 2:
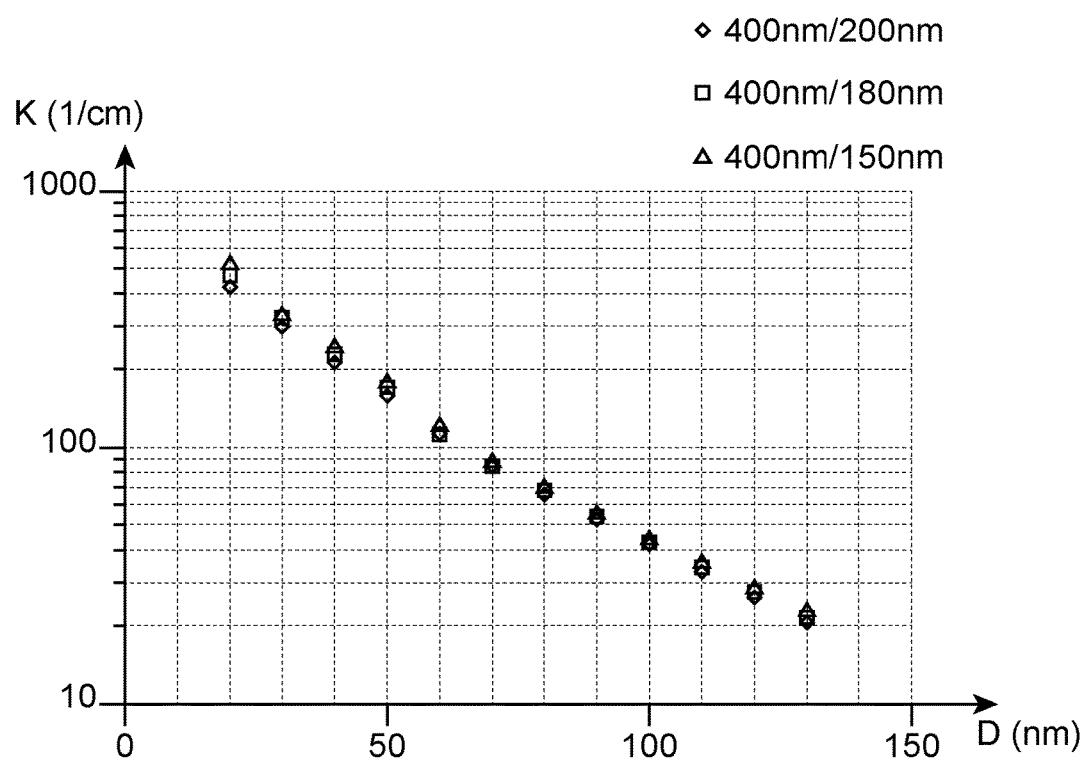
FIG. 2 is a graph also extracted from the works of S. Keyvaninia et al. and representing the variation in the feedback force of a Bragg grating as a function of the thickness of an intermediate layer between the Bragg grating and a gain structure, for different pattern thicknesses of the Bragg grating.

Identical, similar or equivalent parts of the different figures bear the same numerical references so as to make it easier to go from one figure to the next. This is also valid for the prior art illustrated by FIG. 1 which shares, for the similar parts, to more or less the differences linked to the invention, the same referencing.

The different parts represented in the figures are not according to a uniform scale, in order to make the figures more legible.

The different possibilities (alternatives and embodiments) should be understood as not being mutually exclusive and may be combined together.

Above and in the remainder of this document "transversal section" and longitudinal section" are respectively taken to mean a section along a plane perpendicular to the direction of propagation of the guided optical field and a section along a plane parallel to the direction of propagation of the guided optical field and perpendicular to the surface of the substrate.

DETAILED DESCRIPTION OF PARTICULAR EMBODIMENTS

FIGS. 3A to 3D represent respectively schematic top views, in longitudinal section along the plane XX', and in transversal section along the planes Y1Y1' and Y2Y2' of a photonic device 1 according to a first embodiment of the invention comprising a first silicon waveguide 210 and a laser 300 including a gain medium 321 capable of emitting light, the laser 300 being optically connected to the first waveguide 210.

Figure 11A:
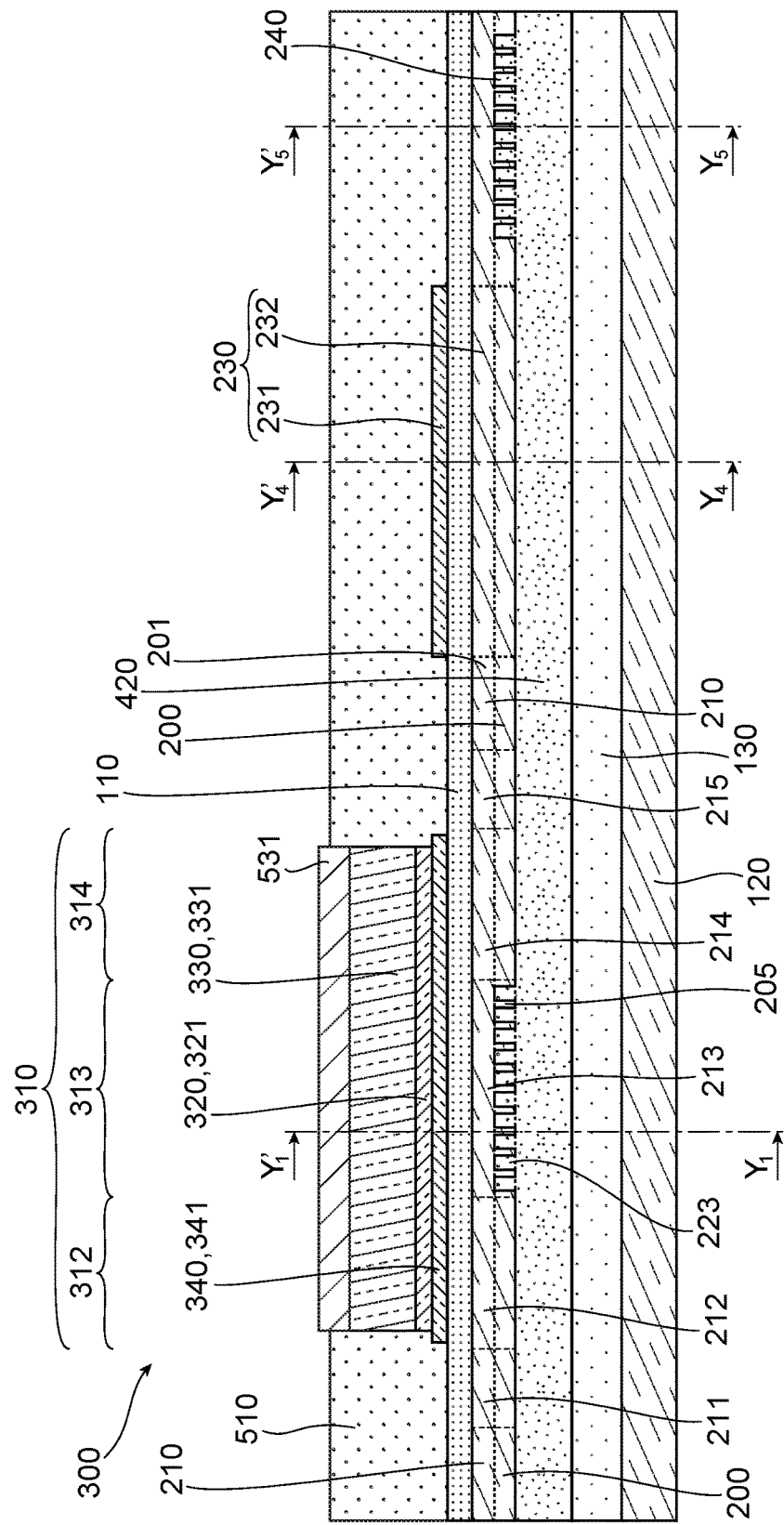
Figure 11B:
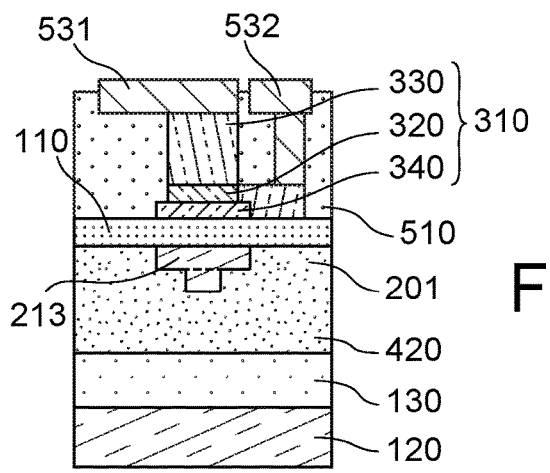

More specifically, the photonic device 1 comprises:
a support 120 comprising a second dielectric layer 130,
an intermediate layer 420 in contact with the support 120 through the second dielectric layer 130, the intermediate layer 420 being constituted of a dielectric material,
an optical guiding level in contact with the intermediate layer opposite to the support 120, the optical guiding level 200 including a part of a first waveguide 210, a first to a fifth waveguide section 211, 212, 213, 214, 215 distinct from the first waveguide 210, the first to the fifth waveguide sections 211, 212, 213, 214, 215 succeeding each other while being optically connected two by two, and being connected to the first waveguide 210 by at least one of the first and the fifth waveguide sections 211, 215, the optical guiding level 200 further including a dielectric filling material 205,
a first layer made of dielectric material 110 covering the optical guiding level 200 on its first face 200A,
a gain structure 310 comprising at least one gain medium 321 capable of emitting light, the gain structure 310 having a central portion facing the third waveguide section 213 and a first and a second end facing the second and the fourth waveguide sections 212, 214, thus, the central portion of the gain structure 310 forms with the third waveguide section 213 a laser hybrid waveguide 313, the second and fourth waveguide sections 212, 214 and the first and second ends of the gain structure 310 forming a first and a second zone of optical transition 312, 314 of an optic mode between the laser hybrid waveguide 313 and respectively the first and the fifth waveguide sections 211, 215, a first and a second electrical contact 531, 532, not represented in FIGS. 3A to 3D and which are shown in FIG. 11B, to electrically contact the gain structure 310, and an encapsulation layer 510, not illustrated in FIGS. 3A to 3D and which is shown in FIG. 11B, encapsulating the gain structure 321 and the first and second electrical contacts 531, 532.

The third waveguide section 213 includes a pattern arranged uniquely over a first part e1 of its thickness, said pattern forming a distributed Bragg grating 223 under the gain structure to form a feedback structure and a resonant cavity including at least one part of the gain medium 321, so doing so as to form a laser 300 optically connected to the first waveguide 210 by at least one of the first and the fifth waveguide sections 211, 215. The first part e1 of the thickness of the third waveguide section 213 on which is arranged the pattern is situated at a distance from the first dielectric layer 110 and thus from the gain structure 310. Such an arrangement at a distance from the first part e1 of the thickness of the third waveguide section 213 is provided by means of a second part e2 of the thickness of the third waveguide section 213 arranged between the first part e1 of the thickness of the third waveguide section 213 and the first dielectric layer 110. In other words, the second thickness part e2 of the third waveguide section 213 is interposed between the first thickness part e1 of the third waveguide section 213 and the first dielectric layer 110.

Figure 3A:
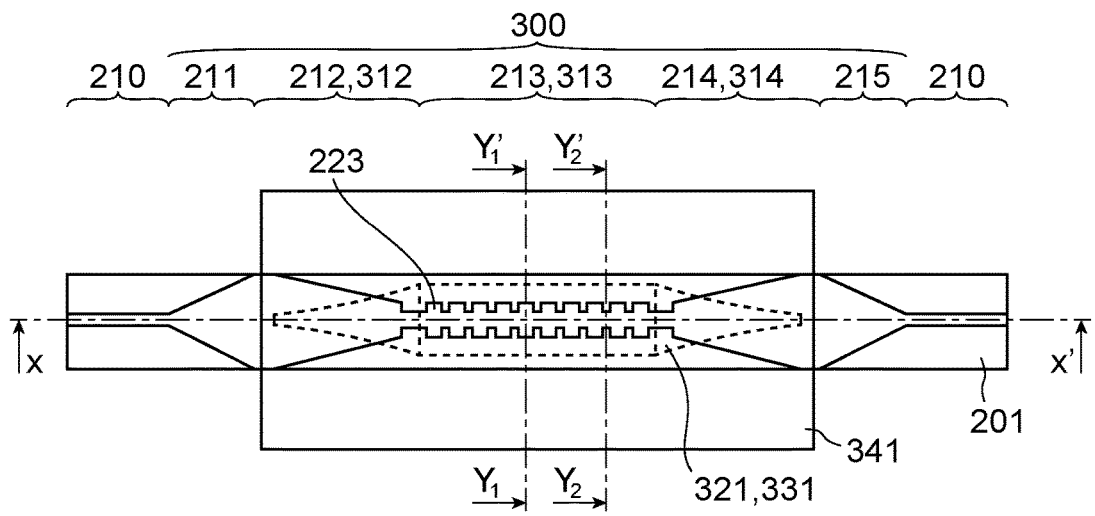
FIGS. 3A to 3D illustrate respectively a top view, a longitudinal sectional view, a transversal sectional view along a plane Y1Y1' and a transversal sectional view along a plane Y2Y2' of a photonic device according to a first embodiment of the invention, the sectional planes Y1Y1' and Y2Y2' being shown in FIG. 3A FIGS. 4A to 4D illustrate, for FIGS. 4A and 4B, transversal sectional views of a laser hybrid waveguide of respectively the photonic device illustrated in FIGS. 3A to 3D and a photonic device according to the prior art, the thickness of a silicon layer being identical for these two optical devices, and FIGS. 4C and 4D graphically representing the variation in the Kappa value of a Bragg grating of respectively the optical device of FIG. 4C and that of FIG. 4D, as a function of the widths of the wide ridges and narrow ridges.
Figure 3B:
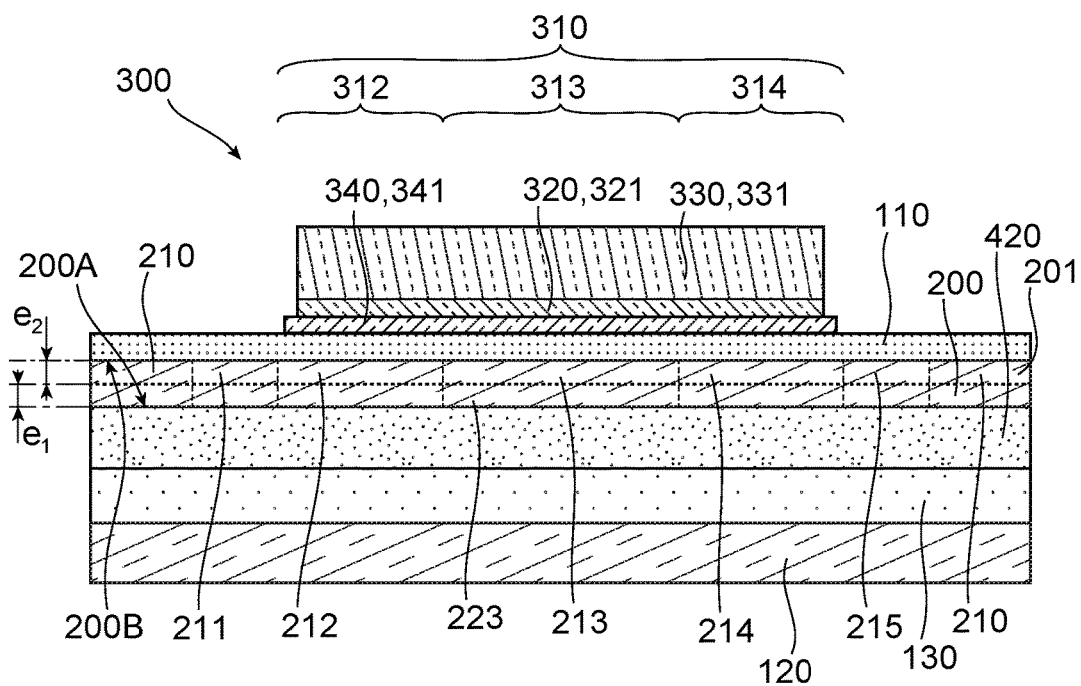

It will be noted that, by simplification and as is indicated hereafter, FIGS. 3A and 3B do not illustrate any quarter wave defect in the distributed Bragg grating 223, or total reflector on one side of the laser; one or the other each being known to those skilled in the art to ensure the emission of the DFB type laser following a single mode of the cavity. It will also be noted that in order to make it easier to read, FIG. 3A has been illustrated schematically so as to only show certain components of the photonic device. Thus, for example, the electrical contact 531 and the encapsulation layer 510, which are notably present in FIGS. 11A to 11D, have not been represented in FIGS. 3A to 3D. With the same aim, such a schematic representation is also used for all of the top views and sectional views of the present document apart from FIGS. 11A to 12C. Thus, the electrical contacts and the encapsulation in the material 510 are only shown in FIGS. 11A to 12C.

The support 120 is a support compatible with the constraints of microelectronics and optoelectronics and may be a support made of semiconductor material or dielectric material. In a particular application of the invention, the support may be a support made of crystalline silicon. According to this possibility and according to an alternative not illustrated in FIGS. 3A and 3B, the support may also integrate electronic control and/or reading components complementary to the optical components, such as the laser 300 and active components accommodated in the first waveguide 210, and electrical interconnections connecting said electronic components to said optical components by means of metal vias and lines housed in the dielectric filling material 205 and the intermediate layer 420. In the same way and according to an alternative to this first embodiment, the support 120 may also comprise through electrically conducting vias contributing to the formation of the electrical contacts 531, 532, 533, 534 enabling an electrical connection of these same optical components to a second substrate, the second so-called control substrate, integrating said electronic control and/or reading components complementary to the optical components.

As illustrated in FIG. 3B, the support 120 comprises a second dielectric layer 130.

The second dielectric layer 130 is preferentially suited to enable bonding by molecular adhesion of the intermediate layer 420 on the support 120. Thus, the second dielectric layer 130 has to this end a second flat bonding surface. In the particular application of the invention, the second dielectric layer 130 is made of silicon dioxide $SiO_2$.

The intermediate layer 420 comprises a first face, preferentially forming a first flat bonding surface, through which it is in contact with the second dielectric layer 130, and a second face opposite to the first face. The intermediate layer 420 includes a dielectric material in such a way that the second and fourth waveguide sections 212, 214 are in contact with the intermediate layer 420 on a part of the intermediate layer 420 which is constituted uniquely of dielectric materials. The intermediate layer is also in contact with the third waveguide section 213.

It will be noted that with such a configuration according to the invention, the intermediate layer 420 does not comprise, facing each of the second and the fourth waveguide sections 212, 214, overthickness of any type and that the third waveguide section 213 is not facing any space delimited by such overthicknesses.

The dielectric material of the dielectric layer is preferentially silicon dioxide $SiO_2$. According to one possibility of the invention, not illustrated in FIGS. 3A to 3B, the intermediate layer may comprise several dielectric materials in the form of several sub-layers.

The intermediate layer 420 is in contact through its second face with the optical guiding level 200. The optical guiding level 200 comprises a first face 200A through which it is in contact with the intermediate layer 420 and a second face 200B opposite to its first face 200A.

Figure 5A:
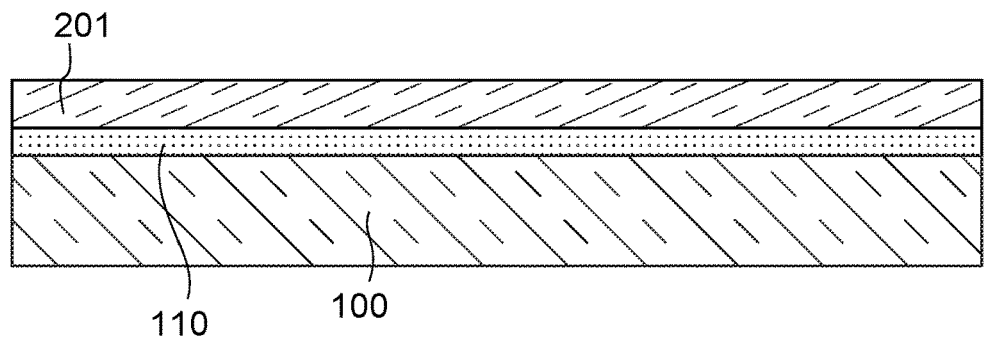
FIGS. 5A to 5F illustrate, in longitudinal sectional views, the main steps for manufacturing a photonic device as illustrated in FIGS. 3A to 3F, FIG. 6A to 6D illustrate respectively a top view, a longitudinal view, a transversal sectional view along a plane Y1Y1' and a transversal sectional view along a plane Y2Y2' of the intermediate device shown in FIG. 4B, the sectional planes Y1Y1' and Y2Y2' being shown in FIG. 6A, FIGS. 7A and 7B illustrate respectively a top view and a longitudinal sectional view of a device according to a second embodiment in which a gain structure of the photonic device has a first and a second end including a constant transversal section.
Figure 5B:
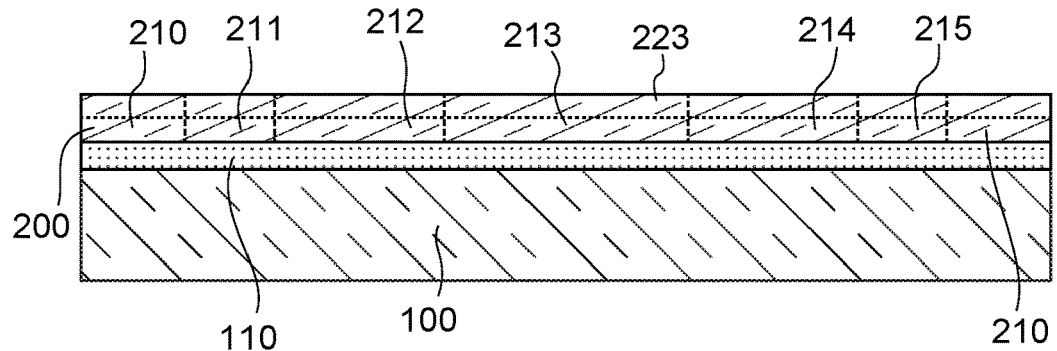

In this first embodiment, the optical guiding level 200 is formed from a silicon layer 201, illustrated in FIG. 5A derived from a silicon layer on dielectric layer 110 type substrate. This type of substrate is better known as SOI (silicon on insulator).

In a particular configuration of the invention, the silicon layer 201 is a superficial silicon layer derived from a silicon on insulator (SOI) substrate. Such a silicon layer 201 derived from a substrate of 501 substrate type offers among others the advantage of having good crystalline quality and controlled thickness, making it possible to provide a first waveguide 210 and waveguide sections 211, 212, 213, 214, 215 having low optical losses. In a particular configuration of the invention, the dielectric layer 110 is made of silicon dioxide $SiO_2$, and is known as buried oxide (BOX) layer. The use of such a SOI substrate also has the advantage of enabling the provision of a first dielectric layer 110 of controlled thickness and planeness through the BOX layer.

In an alternative of this configuration using a single silicon layer 201 formed by a superficial silicon layer of a SOI substrate and a dielectric layer 110 derived from the BOX of the same SOI substrate, it may also be envisaged to use a first silicon layer, derived from a SOI substrate on a dielectric layer 110, in association with a second silicon layer in direct contact with said first silicon layer, or in contact with said first silicon layer by means of an intermediate layer made of dielectric material. This second silicon layer may be either deposited by a deposition method, or be a layer transferred by molecular bonding.

In the particular application of the invention, the silicon layer 201 has a thickness of 300 nm or 500 nm.

The first waveguide 210 and the first to fifth waveguide sections 211, 212, 213, 214, 215 are obtained, in this first embodiment, by etching of the silicon layer 201.

Obviously, as illustrated in the remainder of this document, notably in relation with FIGS. 11A to 11D, the first waveguide 210 may also accommodate other components, whether they are optical, such as an optical modulator and a surface coupling grating, not illustrated in FIGS. 3A and 3B, and/or electronic, in accordance with the teaching of Jason S. Orcutt and his co-authors in the article 'Open foundry platform for high-performance electronic-photonic integration' published in 2012 in the scientific journal "Optics express", volume 20, number 11, pages 12222-12232.

As regards the optical component(s), these may be active components, such as modulators, photodetectors and phase shifters, or passive components such as wavelength multiplexers, surface coupling gratings and couplers through the edge of the chip. To this end, to enable an electrical connection of the active optical components and/or optional electronic components, the photonic device 1 may further include metal vias housed in the dielectric material 205 and the intermediate layer 420 and/or in an encapsulation layer of the gain structure 310 and, in the first dielectric layer. Such metal vias are described in greater detail in the remainder of this document in relation with FIGS. 11A to 11D.

Figure 3C:
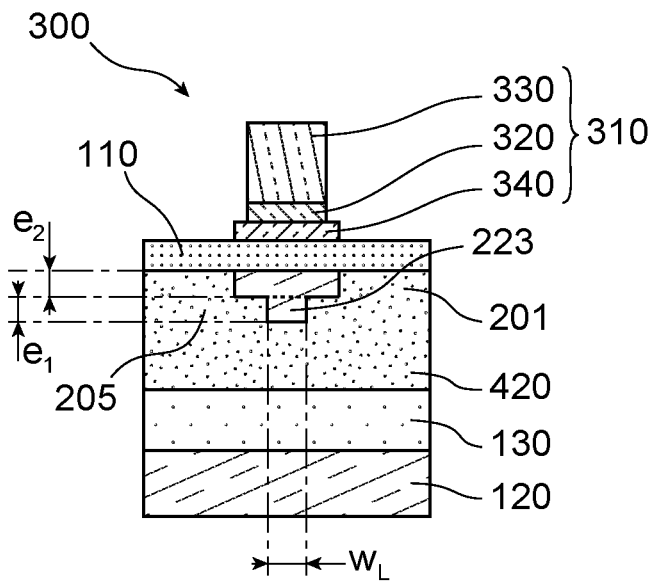
Figure 3D:
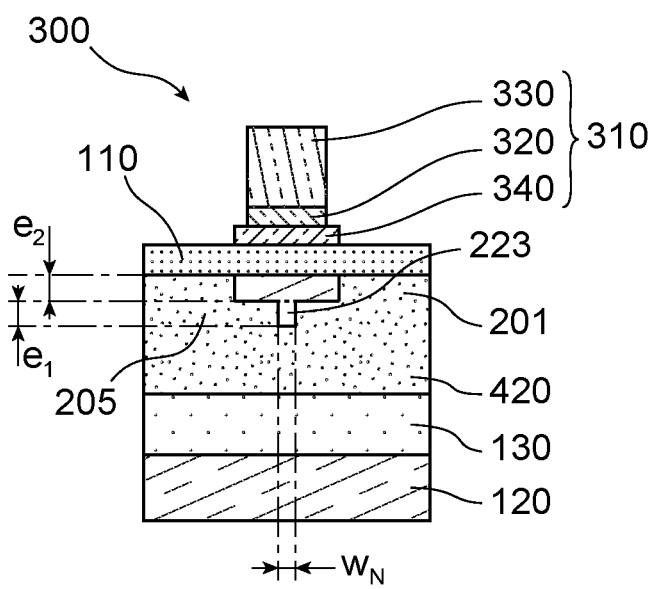

In the practical application of the invention, as illustrated in FIGS. 3C and 3D representing sectional views of the third waveguide section 213 along the sectional planes Y1Y1' and Y2Y2', each of the first waveguide 210 and the first to the fifth waveguides 211, 212, 213, 214, 215 comprises, over a second part e2 of their thickness comprising the second face 200B of the optical guiding level 200, a base and, over a first part e1 of the thickness, comprising the first face 200A of the optical guiding level 200, a portion, designated ridge, having a reduced transversal section vis-à-vis the base.

Obviously, such a shape of the first waveguide 210 and the waveguide sections 211, 212, 213, 214, 215 is purely illustrative of the practical application of the invention and other shapes may be envisaged without going beyond the scope of the invention. Thus and for example, the first waveguide 210 may also have a constant transversal section.

It will also be noted that, according to the alternative in which the optical guiding level 200 is obtained by means of a first silicon layer derived from a silicon layer on dielectric layer 110 type substrate in association with a second silicon layer in contact with said first silicon layer, it may be envisaged that the base is provided by the first silicon layer 201 and that the ridge is provided by the second silicon layer. According to this possibility, the ridge may be provided:
  either by etching said second silicon layer,
  or by depositing the second silicon layer on said first silicon layer in the form of ridges in contact with the base etched beforehand in the first silicon layer.

The waveguide 210 is optically connected to the first waveguide section 211. As illustrated in FIGS. 3A and 3B, in this first embodiment of the invention, the first waveguide 210, like the first to the fifth waveguide sections 211, 212, 213, 214, 215, are formed in the silicon layer 201 in the entire thickness thereof. Obviously, in an alternative, one or more among the first waveguide 210 and the first to the fifth waveguide sections 211, 212, 213, 214, 215 may be formed in a part of the thickness of the silicon layer 201, and thereby have different thicknesses.

The first to fifth waveguide sections 211, 212, 213, 214, 215 succeed each other, the first waveguide section 211 is thus optically connected to the second waveguide section 212 itself being optically connected to the third waveguide section 213, and so on. In this way, the first to the fifth waveguide sections 211, 212, 213, 214, 215 are optically connected to the first waveguide 210 by the first waveguide section 211.

As illustrated schematically in FIG. 3A, The second and the fourth waveguide sections 212, 214 each have, along a direction going from the inside of the gain structure 310 to the outside of the gain structure 310, and in a first part e1 of their thickness:
  over a first part of its length, an increasing transversal section,
  over a second part of its length, a constant transversal section, this second part being optional.

The first and the fifth waveguide sections 211, 215 each have, along a direction going from the inside of the gain structure 310 to the outside of the gain structure 310, and in a first part e1 of their thickness, a transversal section of which the width is decreasing.

Above and in the remainder of this document, transversal section of a waveguide is taken to mean the section of the waveguide along a plane perpendicular to the direction of propagation of light in the guide, and perpendicular to the support 120.

According to one possibility of the particular application of the invention shown in FIG. 3A, each of the first to the fifth waveguide sections 211, 212, 213, 214, 215, in the same way as the first waveguide 210, have a transversal section of constant width forming a base in a second part e2 of their thickness comprising the second face 200B of the optical guiding level 200.

Obviously other configurations of the first, second, fourth, and fifth waveguide sections 211, 212, 214, 215 may also be envisaged without going beyond the scope of the invention.

The third waveguide section 213 comprises the optical feedback structure in the form of a distributed Bragg grating 223 under the central part of the gain structure 310. More specifically, as illustrated in the top view of FIG. 3A, the optical feedback structure is a distributed Bragg grating 223 with "lateral corrugations", that is to say that the variation in optical index of the Bragg grating is provided by a variation in the transversal width of the waveguide.

Thus, according to this possibility, the third waveguide section 213 extends longitudinally along an optical propagation axis of the optical device 1 and the pattern of the third waveguide section 213 consists in an alternation between a portion of transversal section of a first width WL, designated wide ridge and a portion of a transversal section of a second width WN, designated narrow ridge, the values WN and WL respecting the following inequalities: 0<WN<WL. With such a feedback structure, the laser is, in accordance with the invention, a DFB (Distributed Feed Back) type laser.

In the distributed Bragg grating 223 according to the invention, the repetition period of portions of ridges of same width (wide or narrow ridges), in accordance with the principle of a Bragg grating, is substantially $\lambda/2n_{\it eff}$, $\lambda$ being the emission wavelength of the laser 300 and $n_{\it eff}$ the mean effective index of the mode guided by the hybrid waveguide 313. With such a configuration, the distributed Bragg grating 223 is a Bragg grating with "lateral corrugations" partially etched in the thickness of the third waveguide section 213.

In the practical application of the invention and as illustrated in sectional views along the planes Y1Y1' and Y2Y2' shown in FIGS. 3C and 3D, the variation in transversal width for the distributed Bragg grating 223 is realised on a first part e1 of the thickness of the third waveguide section 213 which is at a distance from the first dielectric layer.

Depending on the configuration described, the third waveguide section 213 includes, in the same way as the first, second, fourth and fifth waveguide sections 211, 212, 214, 215, a base over a second part e2 of its thickness. The base has a constant transversal width and a thickness e2 for example equal to 150 nm.

In other words, the third waveguide section 213 has, over the first part e1 of its thickness, that corresponding to the ridge, which is the furthest away from the gain structure 310, an alternation between a transversal section of a first width WL and a transversal section of a second width WN.

It will be noted that according to the invention, the thickness value of the base e2 may be adjusted to modify the feedback force of the distributed Bragg grating 223, as is already the case in pattern of the prior art.

According to an advantageous possibility of the invention not illustrated in FIGS. 3A to 3D, the distributed Bragg grating may comprise a quarter wave type phase defect in order to optimise a selectivity of the resonant cavity.

In an alternative of this possibility and in order to optimise the selectivity of the resonant cavity, the first or the fifth waveguide sections 211, 215 may accommodate a substantially total reflector, the total reflector being able to be selected from Sagnac type reflectors, distributed Bragg gratings, facet type mirrors with high reflectivity treatment. With the same aim and in an alternative, it may also be envisaged that one among the second waveguide section 212 and the fourth waveguide section 214 accommodate a substantially total reflector, the total reflector being able to be selected from distributed Bragg type gratings, facet type mirrors with high reflectivity treatment.

A dielectric filling material 205 fills the parts of the silicon layer 201 hollowed out during the formation of the first waveguide and the first to fifth waveguide sections, this dielectric filling material being able to be, for example, identical to that of the intermediate layer 420.

The optical guiding level has its second face 200B in contact with a first face of the first dielectric layer 110. The first dielectric layer 110 comprises, apart from its first face, a second face, opposite to the first face, through which it is in contact with the gain structure 310

The first dielectric layer 110 is a dielectric layer derived from a substrate of silicon on insulator or SOI type, this being provided by the insulator on which the silicon layer 201 is arranged. According to the practical application of the invention, the first dielectric layer 110 is a layer of silicon dioxide $SiO_2$ of which the thickness is less than 100 nm. The thickness of the first dielectric layer 110 is thereby preferentially less than or equal to 90 nm, or even 70 nm. For example, the first dielectric layer may have a thickness of 15 or 50 nm.

According to an optional possibility of the practical application of the invention corresponding to this first embodiment, the first dielectric layer 110 may be an insulator layer of a silicon on insulator type substrate of which the thickness has been partially thinned.

In an alternative to this first embodiment, the first dielectric layer 110 may be a layer of deposited or transferred dielectric material in contact on the silicon layer 201, the insulator layer of a silicon on insulator type substrate at the origin of the silicon layer 201 having been totally etched. According to another alternative of the invention, not illustrated, the first dielectric layer 110 may comprise a first sub-layer corresponding to an insulator layer of a silicon on insulator type substrate at the origin of the silicon layer 201, this first layer having been preferentially thinned and a second sub-layer deposited or transferred onto the first sub-layer. This second sub-layer may be made of the same dielectric material as the first sub-layer of the first dielectric layer 110 or of another dielectric material.

The first dielectric layer 110 is in contact with the gain structure 310 through its second face.

As illustrated in FIG. 3B, the gain structure 310 comprises:
  a first semiconductor zone 341 of a first type of conductivity formed in a first semiconductor layer 340,
  the gain medium 321 formed in a second semiconductor layer 320,
  a third semiconductor zone 331 of a second type of conductivity opposite to the first type of conductivity and formed in a third semiconductor layer 330.

According to a usual configuration of the invention, the first, the third and the second semiconductor layers 340, 330, 320 and thus the first and third semiconductor zones 341, 331 and the gain medium 321, are all three made of direct gap semiconductor materials such as III-V semiconductors. Thus, the first, and the third semiconductor layers 340, 330 are preferentially made of III-V semiconductors, such as indium phosphide InP or gallium arsenide GaAs, whereas the second semiconductor layer 320 is preferentially formed by a stack of binary, ternary, quaternary compounds of III-V semiconductor materials.

The first and the second type of conductivity are selected from the type of conductivity in which the majority carriers are electrons, that is to say that provided by a so-called N doping, and the type of conductivity in which the majority carriers are holes, that is to say that provided by a so-called P doping.

FIGS. 3B, 3C and 3D thereby illustrate more specifically the arrangement of the first and third semiconductor zones 341, 331 and the gain medium 321 in order to form the gain structure 310. The first semiconductor zone 341 has a first face in contact with the first dielectric layer 110 and a second face opposite to the first face through which it is in contact with the gain medium 321. The gain medium 321 comprises a first face through which it is in contact with the first semiconductor zone 341 and a second face opposite to the first face through which it is in contact with the third semiconductor zone 331.

The first semiconductor zone 341 has a width greater than that of the gain medium 321 and the third semiconductor zone 331 in order to allow a contact to be made by means of the second electrical contact, not illustrated in FIGS. 3A to 3D.

The gain medium 321 and the third semiconductor zone 331 have an identical width. The first semiconductor zone has on its second face a part in contact with a first electrical contact, not illustrated.

The gain structure 310 is arranged, as illustrated in FIG. 3B, in contact with the second face of the first dielectric layer 110 in such a way that the gain structure 310 has a central portion facing the third waveguide section 213. With such a configuration:
  the central portion of the gain structure 310 forms with the third waveguide section 213 a laser hybrid waveguide, the second waveguide section 212 and the first end of the gain structure 310 form a first zone of optical transition 312 of the optic mode between the optical hybrid waveguide 313 and the first waveguide section 211, the fourth waveguide section 214 and the second end of the gain structure 310 form a second zone of optical transition 314 of the optic mode between the optical hybrid waveguide 313 and the fifth waveguide section 215.

Thus, the gain structure 310 is, with the exception of its first and second ends, facing the third waveguide section 213. With such an arrangement, the gain medium 321 is optically coupled with the optical feedback structure making it possible to form a resonant cavity including the gain medium 321.

In this first embodiment, as illustrated in FIG. 3A, each of the first and the second ends of the gain structure 310 has, over a part of its thickness and along a longitudinal direction moving away from the central portion, a transversal section of which the width decreases. More specifically, each of the gain medium 321 and the third semiconductor zone 331 have, at the level of the first and the second ends of the gain structure, a transversal section of which the width is decreasing along a longitudinal direction moving away from the central portion. In other words, each of the gain medium 321 and the third semiconductor zone 331 have a first and a second tapered end. The first semiconductor zone 341 has, for its part, a constant transversal section over the whole of its length.

Such a variation in section at the two ends, and over a part of the thickness, of the gain structure 310 is particularly suited to a thickness of silicon layer 201 less than 700 nm, or less than 500 nm, and being able to be equal to 400 nm, or even 300 nm.

Such a photonic device 1 is particularly advantageous vis-à-vis the prior art notably as regards the possibility of obtaining kappa values of the feedback force of the Bragg grating 223 compatible with a low thickness of the first dielectric layer 110.

Figure 4A:
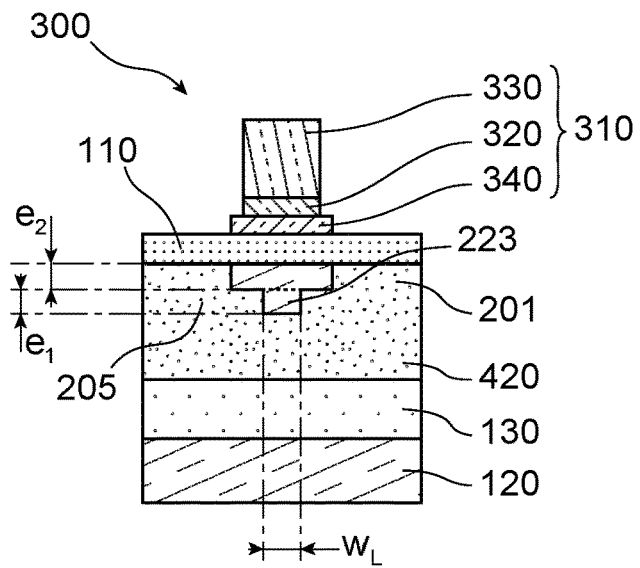
Figure 4B:
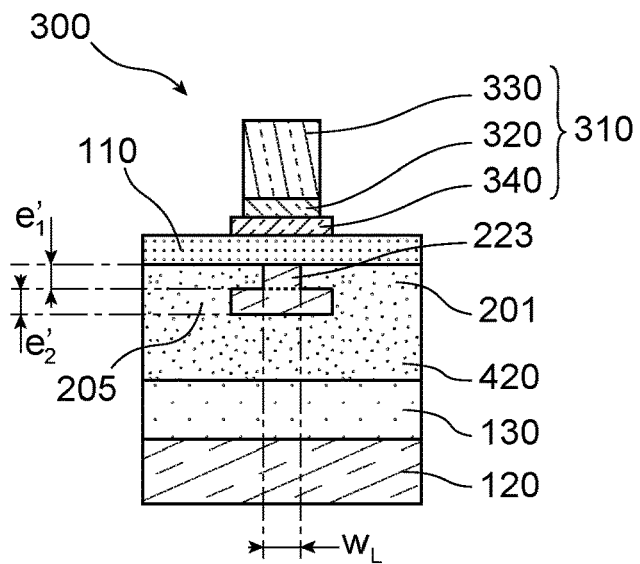

In order to illustrate such an advantage, FIGS. 4A and 4B show a transversal sectional view of the laser hybrid waveguide 313 of a photonic device 1 according to respectively the first embodiment of the invention, which is thus in accordance with the invention, and according to the prior art.

The configuration common to these two photonic devices 1 is the following:

a silicon layer 201 of thickness equal to 300 nm, a first dielectric layer 110, made of silicon dioxide $SiO_2$, of thickness equal to 20 nm, a first thickness $e_1$, $e_1'$, that is to say of the ridge of the third waveguide section 213, equal to 150 nm, a second thickness $e_2$, $e_2'$, that is to say the base of the third waveguide section 213, equal to 150 nm.

Thus, the photonic device 1 according to the first embodiment illustrated in FIG. 4A and the photonic device 1 according to the prior art illustrated in FIG. 4B are distinguished uniquely by the arrangement of the base, said base being in contact with the first dielectric layer 110 for the photonic device 1 according to the invention and in contact with the intermediate layer 420 for the photonic device 1 according to the prior art.

Figure 4C:
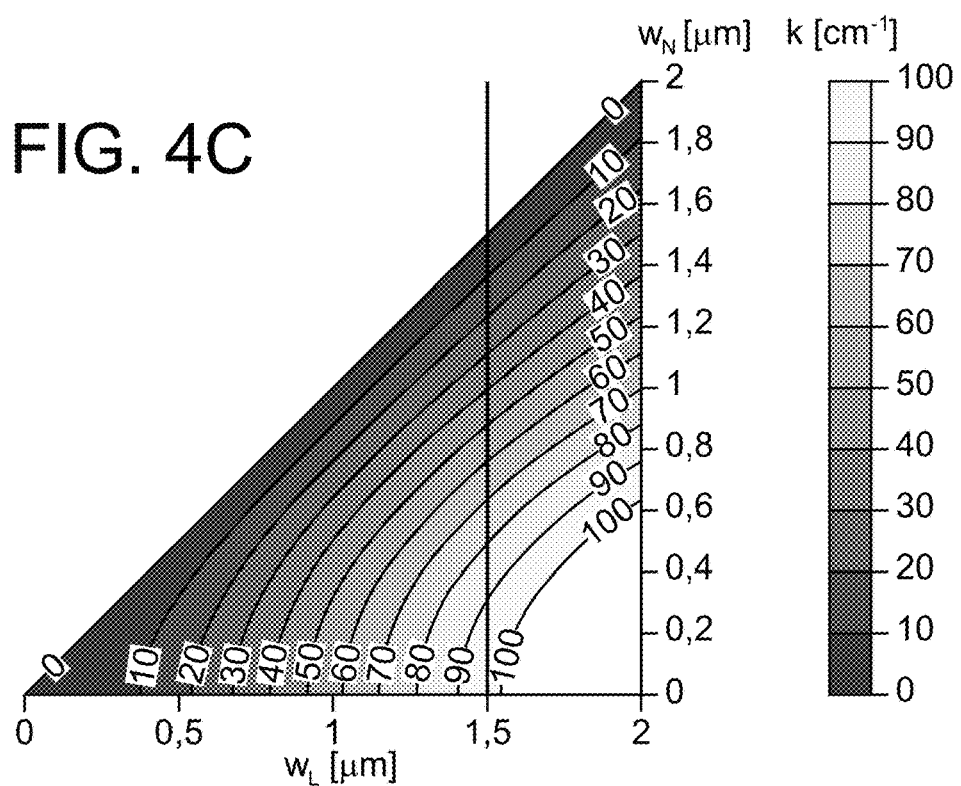
Figure 4D:
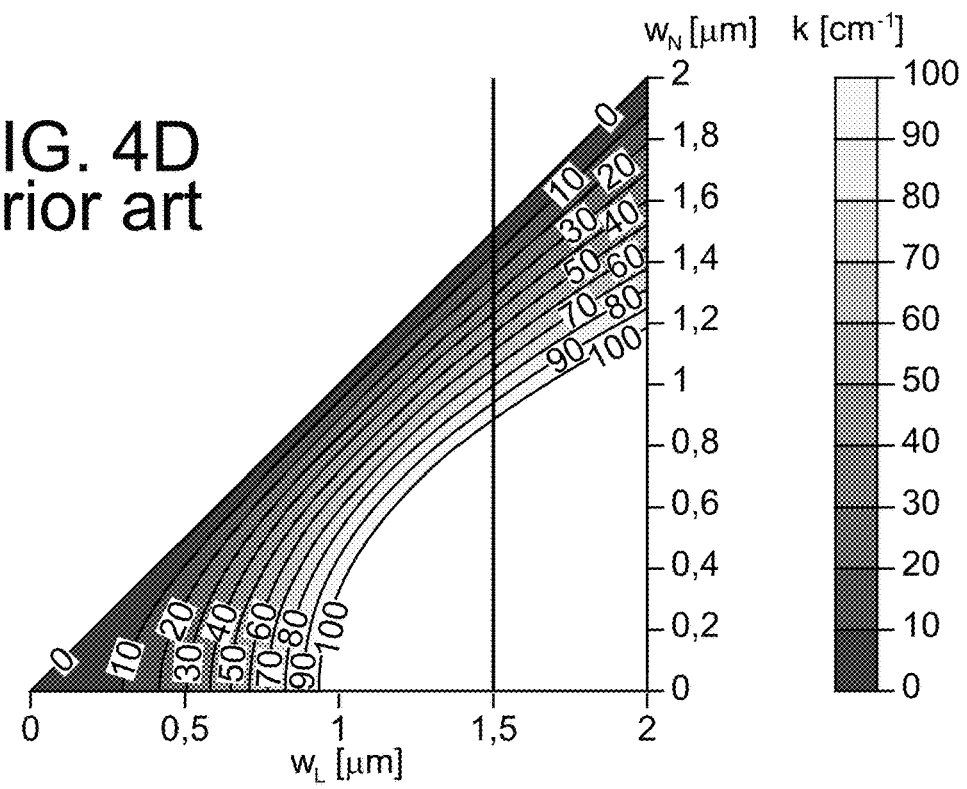

The inventors have calculated the variation in the feedback force for the Bragg grating of the photonic device 1 according to the invention in accordance with FIG. 4A and for the photonic device 1 according to the prior art in accordance with FIG. 4B, as a function of the first width WL and the second width WN. FIGS. 4C and 4D illustrate the results of these calculations for respectively the photonic device 1 illustrated in FIG. 4A and the photonic device 1 illustrated in FIG. 4B, with on the X-axis the first width WL and on the Y-axis the second width WN, the kappa feedback force value being represented in the form of isovalue contours in the graphs of FIGS. 4C and 4D.

It may thus be observed in FIGS. 4D and 4C that, for a first width WL of 1.5 µm, suited for a silicon layer 201 of 300 nm, the feedback force value varies between 0 to a value very considerably exceeding 100 $cm^{-1}$ for the photonic device of the prior art whereas the photonic device according to the invention makes it possible to obtain a reduced feedback force not exceeding 100 $cm^{-1}$. Thus, as these values show, the invention makes it possible to obtain a feedback force that is satisfactory for the formation of lasers of length of central active zone greater than or equal to 50 µm.

FIGS. 5A to 5E illustrate the main manufacturing steps of a method for manufacturing a photonic device 1 according to the invention. Such a manufacturing method, in the same way as all the methods described in the present document, is particularly suited for the implementation of its manufacturing steps in parallel to enable the simultaneous formation of a plurality of photonic devices 1 on a same support 120. With such an in parallel implementation, such a method for manufacturing photonic devices is designated collective method.

Figure 5C:
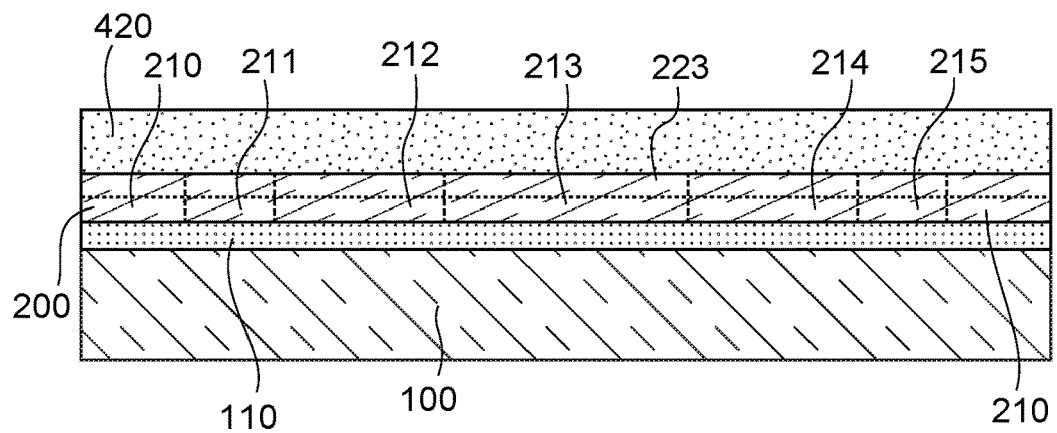
Figure 5D:
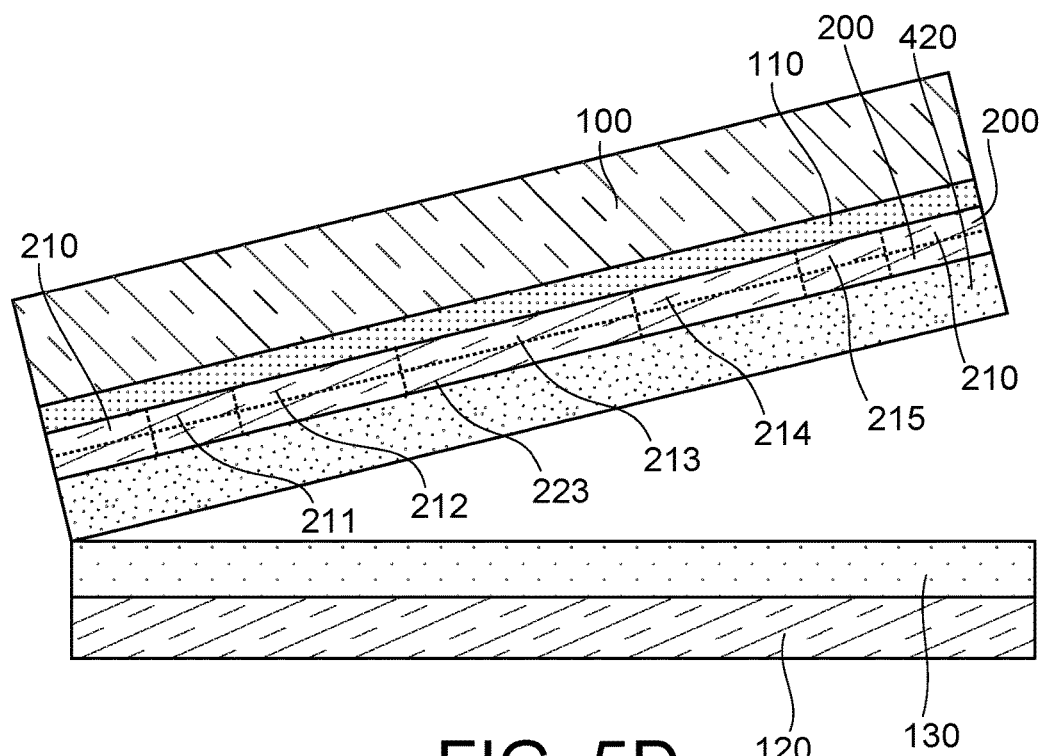
Figure 5E:
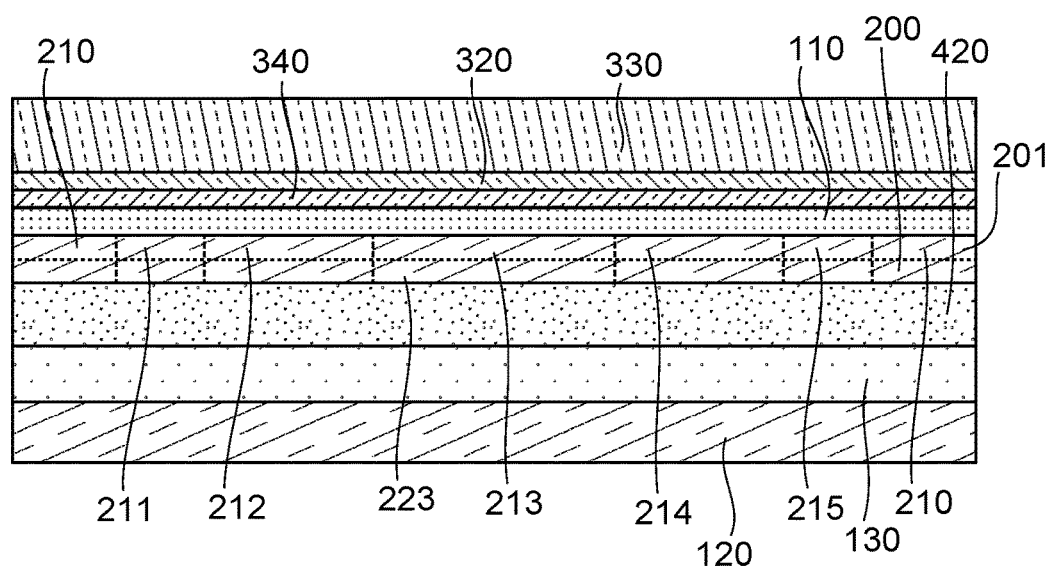
Figure 5F:
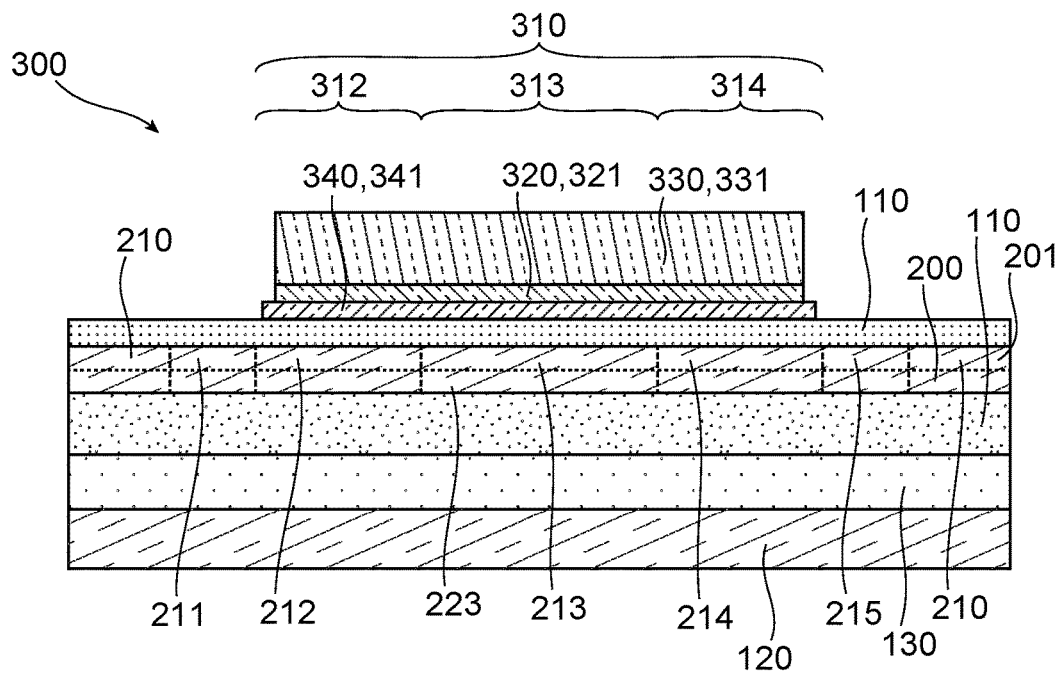

Such a manufacturing method comprises the following steps:

providing a substrate 100 associated with at least one first silicon layer 201 on a first dielectric layer 110, as illustrated in FIG. 5A, patterning the silicon layer 201 to form the first waveguide 210 and the first to fifth waveguide sections 211, 212, 213, 214, 215 distinct from the first waveguide 210, the first to the fifth waveguide sections 211, 212, 213, 214, 215 succeeding each other and being optically connected two by two, and being optically connected to the first waveguide 210 by at least one of the first and the fifth waveguide sections 211, 215, the third section 213 including a pattern arranged uniquely over a first part e1 of its thickness, said pattern forming a distributed Bragg grating 223, as shown in FIG. 4B and FIGS. 6A to 6D, burying the first waveguide 210 and the first to fifth waveguide sections 211, 212, 213, 214, 215 by at least one dielectric material 205 and planarization of said dielectric material in order to form an optical guiding level 200, including the first waveguide 210, the first to fifth waveguide sections 211, 212, 213, 214, 215 and the dielectric material 205, and an intermediate layer 420 in contact with said optical guiding level 200, the third waveguide section 213 being in contact with the intermediate layer 420, the second and fourth waveguide sections 212, 214 being in contact with the intermediate layer 420 on a part of the intermediate layer which is constituted uniquely of dielectric materials, a substrate 100/first dielectric layer 110/optical guiding level 200/intermediate layer 420 assembly thereby being formed, as illustrated in FIG. 5C, providing a support 120 comprising a second dielectric layer 130, assembling the substrate 100/first dielectric layer 110/optical guiding level 200/intermediate layer 420 assembly on the support 120, the assembly being carried out by molecular bonding of the intermediate layer on the support 120, as shown in FIG. 5D, removal of the substrate 100, forming the first, second and third semiconductor layers 340, 320, 330, as illustrated in FIG. 5E, partial etching of the first, second and third semiconductor layers 340, 320, 330 so as to form the gain structure 310 comprising at least the gain medium 321, the gain structure 310 being in contact with the first dielectric layer 110 while having a central portion of the gain structure 310 facing the third section 213 and a first and a second end facing the second and the fourth section 212, 214, thus, the central portion of the gain structure 310 forms with the third waveguide section 213 a laser hybrid waveguide 313, the second and fourth waveguide sections 212, 214, and the first and second ends of the gain structure 310 forming a first and a second zone of optical transition 312, 314 of an optic mode between the laser hybrid waveguide 313 and respectively the first and the fifth waveguide sections 211,215, the photonic device 1 thereby being formed, during said formation of the structure, the first part e1 of the thickness of the third section over which is arranged the pattern being situated at a distance from the first dielectric layer 110, as illustrated in FIG. 5F.

Within the scope of such a manufacturing method and according to a possibility not illustrated, it may also be envisaged to provide a step of partial thinning of the first dielectric layer 110. Such a step of thinning the first dielectric layer 110 may be either a chemical etching step, a dry etching step, or a chemical mechanical polishing step, or a combination of these steps, so doing in order to conserve optimal control of the thinning of the thickness of the first dielectric layer 110.

Within the scope of such a manufacturing method and according to a possibility not illustrated, it may also be envisaged to provide a step of partial or total removal of the first dielectric layer 110, by dry or chemical etching and a step of forming an alternative first dielectric layer 110 by deposition or transfer of a dielectric material as a complement or replacement for the partially or totally thinned dielectric layer, followed by an optional step of planarization of this alternative first dielectric layer 110.

Obviously it will be noted that if in this first embodiment the first waveguide 210 and the first to fifth waveguide sections 211, 212, 213, 214, 215 are formed by etching of the silicon layer 201, it may also be envisaged, in an alternative of this first embodiment, that only a single part of the thickness of the first waveguide 210 and the first to the third waveguide sections 211, 212, 213, 214, 215, for example the second thickness, is formed in the silicon layer 201, the remainder being provided by the deposition of a second silicon layer, not illustrated. According to this alternative, the pattern of the silicon layer 201 may be prior or subsequent to the deposition of the second semiconductor layer 320, the latter then being able to be structured either directly at the deposition, by deposition through a hard mask, or by etching after the deposition.

According to this alternative, instead of the step of patterning the silicon layer 201 to form the first waveguide 210 and the first to fifth waveguide sections 211, 212, 213, 214, 215 distinct from the first waveguide 210, the following steps may be provided:

patterning the silicon layer 201 to form a second part e2 of the thickness of the first waveguide 210 and the first to fifth waveguide sections 211, 212, 213, 214, 215 from the first waveguide 210, forming in an additional silicon layer a first thickness part e1 of the first waveguide 210 and the first to fifth waveguide sections 211, 212, 213, 214, 215 distinct from the first waveguide 210.

According to this alternative of the invention, the step of forming in the silicon layer the first thickness part e1 of the first waveguide 210 and the first to fifth sections 211, 212, 213, 214, 215 may include the following sub-steps:

burying the second thickness part e2 of the first waveguide 210 and the first to fifth waveguide sections 211, 212, 213, 214, 215, by the dielectric filling material 205 and planarization of said dielectric material 205, forming the additional silicon layer in contact of the second thickness part e2 of the first waveguide 210 and the first to fifth waveguide sections 211, 212, 213, 214, 215, patterning the additional silicon layer to form the first thickness part e1 of the first waveguide 210 and the first to fifth waveguide sections 211, 212, 213, 214, 215.

It will be noted that the sub-step of forming the additional silicon layer may not only be a sub-step of depositing said additional silicon layer but also a sub-step of transferring such an additional silicon layer.

FIGS. 6A to 6D illustrate, by respectively a top view, a longitudinal sectional view along the plane XX', and two transversal sectional views along the planes Y1Y1' and Y2Y2' and in a more precise manner, the step of patterning the silicon layer 201 to form the first waveguide 210 and the first to the fifth waveguide sections 211, 212, 213, 214, 215.

Figure 6A:
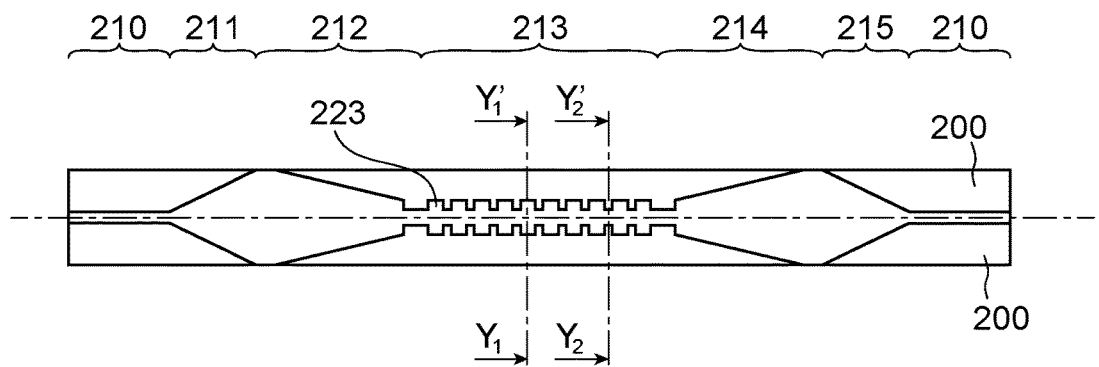
Figure 6B:
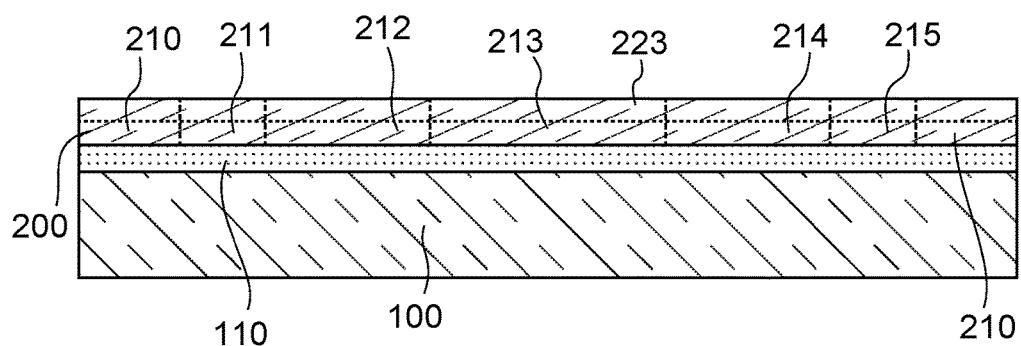
Figure 6C:
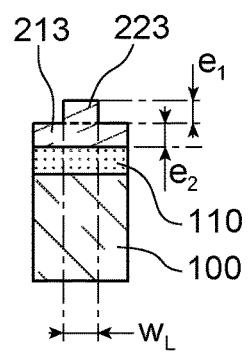
Figure 6D:
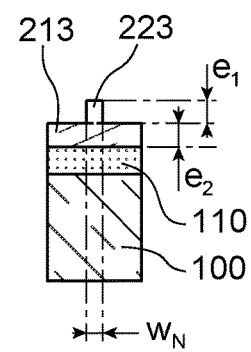

In FIG. 6A may also be seen the lateral corrugations of the third waveguide section 213 formed over a first thickness e1 of the third waveguide section 213, these corrugations being formed in contact with the second part e2 of the third waveguide section 213, as clearly shown in FIGS. 6C and 6D.

Figure 7A:
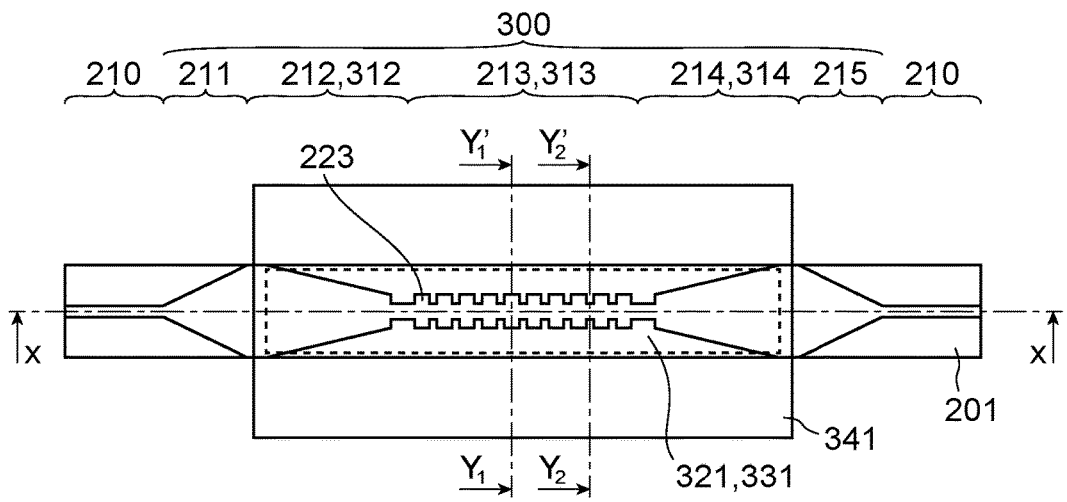
Figure 7B:
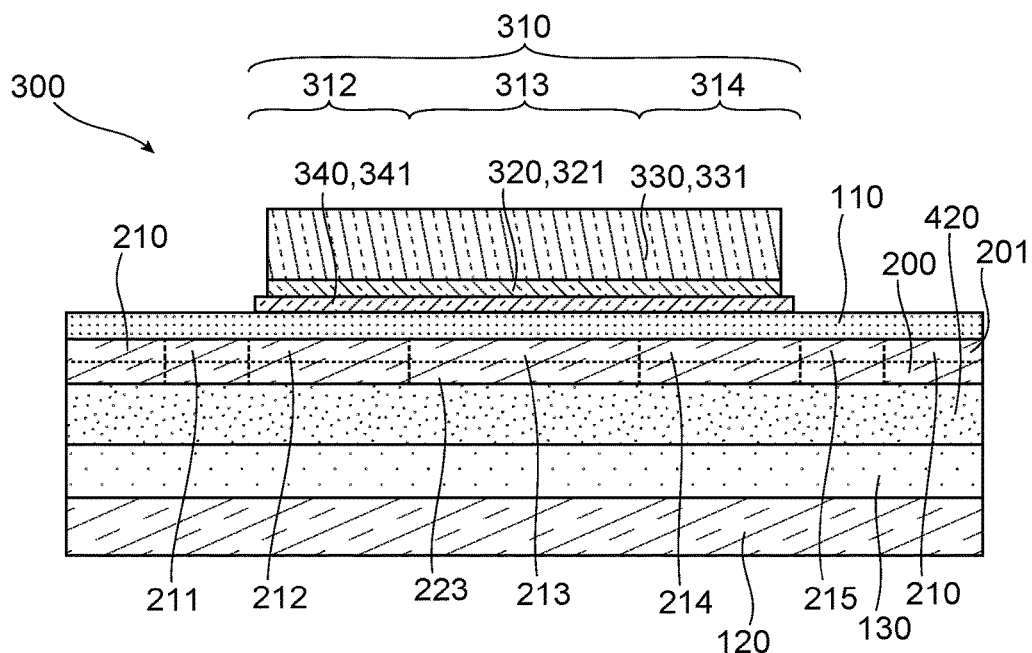

FIGS. 7A and 7B illustrate a photonic device 1 according to a second embodiment in which the first semiconductor zone 331, the second semiconductor zone 341 and the gain medium 321 each have, over its respective length, a constant transversal section over the entire length of the gain structure 310. Such a photonic device 1 differs from a photonic device according to the first embodiment by virtue of the shape of the gain structure 310. Such a constant transversal section makes it possible to provide transition zones particularly suited to a thickness of silicon layer 201 greater than 500 nm, and for example equal to 700 nm.

It will be noted that the method for manufacturing a photonic device 1 according to this second embodiment of the invention differs from a photonic device 1 according to the first embodiment in that during the step of partial etching of the first, second and third semiconductor layers 340, 320, 320, the gain structure 310 extends longitudinally along an optical propagation axis of the optical device 1 and the first semiconductor zone 331, the second semiconductor zone 341 and the gain medium 321 have, over their respective lengths, a transversal section of constant width.

Figure 8A:
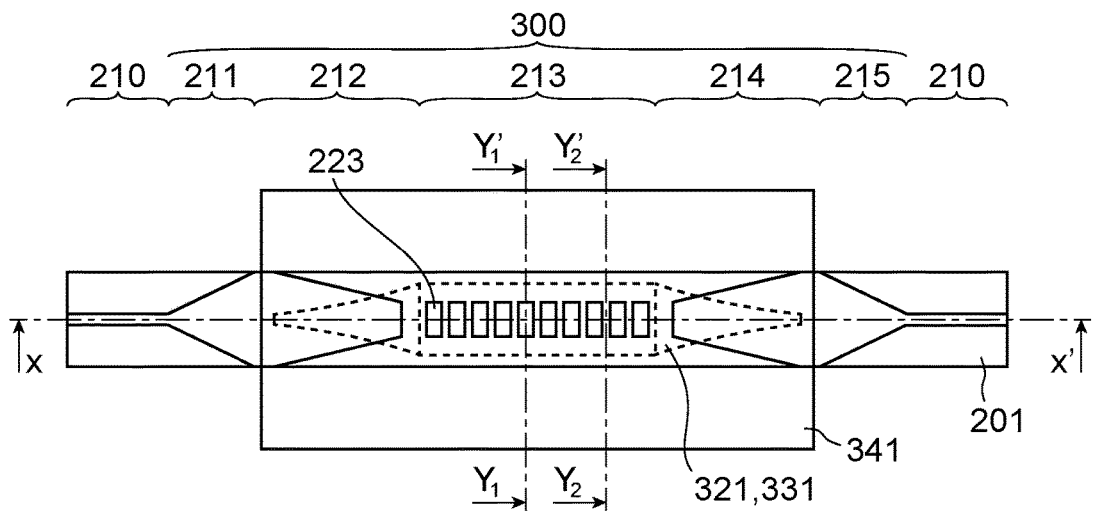
FIGS. 8A to 8B illustrate respectively a top view, a longitudinal sectional view, a transversal sectional view along a plane Y1Y1' and a transversal sectional view along a plane Y2Y2' of a photonic device according to a third embodiment in which a pattern of a third waveguide section has over a first thickness an alternation between a transversal section of a first width and a transversal section of a second width of zero value, the sectional planes Y1Y1 and Y2Y2' being shown in FIG. 7A, FIGS. 9A to 9E illustrate, in longitudinal sectional views, the main steps for manufacturing a photonic device as illustrated in FIGS. 7A to 7D, FIGS. 10A and 10B illustrate respectively a top view and a longitudinal sectional view of a device according to a fourth embodiment in which a gain structure of the photonic device has a first and a second end including a constant transversal section and the third waveguide section is similar to that of the device according to FIGS. 7A to 7D, FIGS. 11A to 11D illustrate respectively a longitudinal sectional view, a first, second and third transversal sectional views along the sectional planes Y1Y1', Y4Y4' and Y5Y5' of a photonic device according to a fifth embodiment of the invention including a capacitive modulator, the sectional planes Y1Y1', Y4Y4' and Y5Y5' being shown in FIG. 11A, FIGS. 12A to 12C illustrate respectively a top view, a longitudinal sectional view and a transversal sectional view along a plane Y6Y6' of a device according to a sixth embodiment in which the gain structure is of the lateral type, the sectional plane Y6Y6' being shown in FIG. 12A.
Figure 8B:
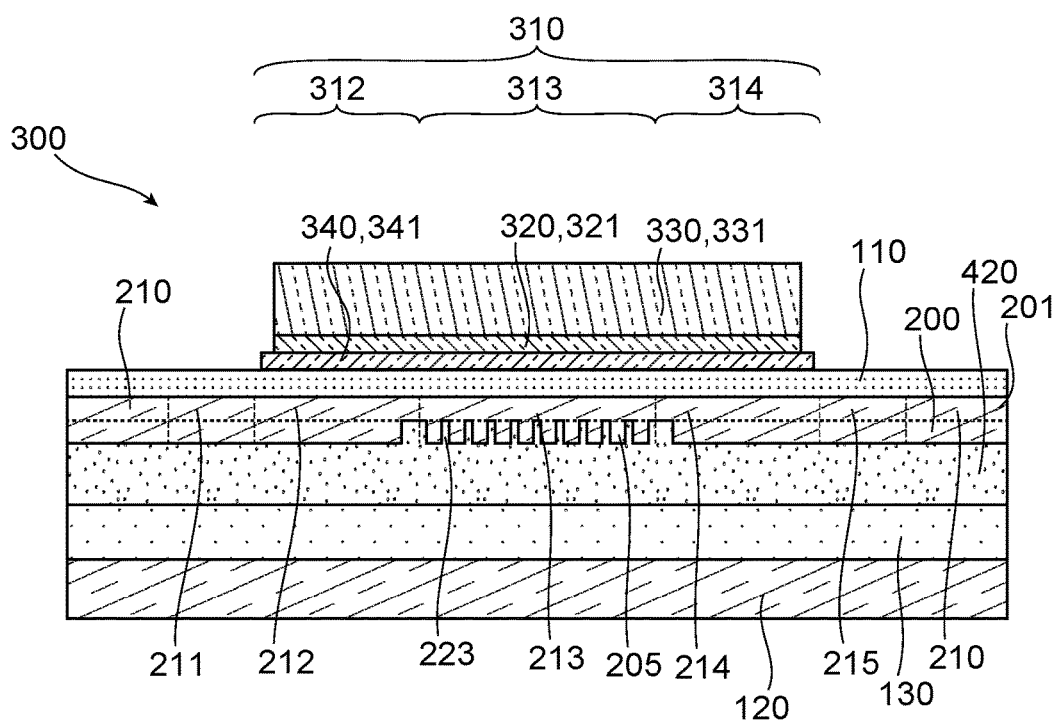

FIGS. 8A and 8B illustrate a top view and a longitudinal sectional view along the plane XX' of a photonic device according to a third embodiment in which the laser 300 comprises an optical feedback structure provided by a distributed Bragg grating of the "vertical corrugation" type. Such a photonic device differs from a device according to the first embodiment by virtue of the type of pattern of the third waveguide section 213.

Indeed, as shown in FIGS. 8A and 8B, in this third embodiment the second width WN of the pattern of the third waveguide section 213 is zero.

Thus, a pattern is obtained in the third waveguide section 213 realised over the first part e1 of its thickness situated at a distance from the first dielectric layer 110 and which may have, for example, a thickness of 150 nm. This first part e1 of the thickness corresponds to the thickness of the transversal section of the ridge of the third waveguide section 213. The feedback structure thereby has a thickness varying between zero thickness, and a non-zero thickness e1 corresponding to that of the first part e1 of the third waveguide section 213. The period of alternation between the zero thickness and the thickness of the first thickness part e1, according to the principle of a Bragg grating, is substantially equal to $\lambda/2n_{eff}$, $\lambda$ being the emission wavelength of the laser 300. The second thickness part e2 of the third waveguide section 213 has a constant thickness and forms the base of the third waveguide section 213.

Figure 9A:
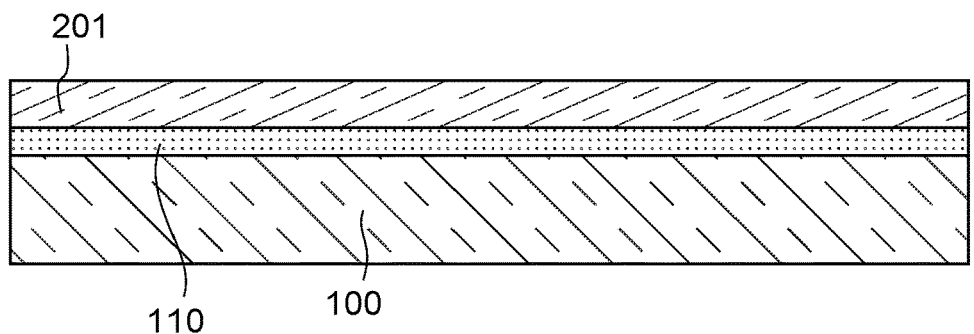
Figure 9B:
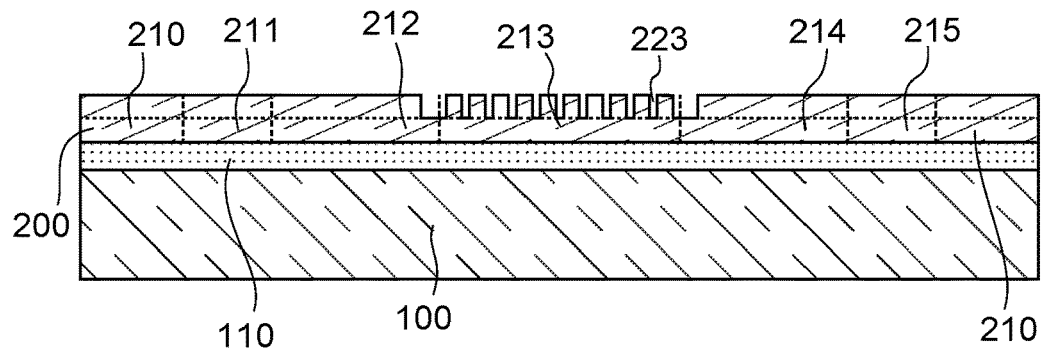

As shown in FIGS. 9A to 9E which illustrate by longitudinal sectional views (along the plane XX' of FIG. 8A) the main steps of a method for manufacturing a photonic device 1 according to this third embodiment, such a manufacturing method differs from the method for manufacturing a photonic device according to the first embodiment in that, as illustrated in FIG. 9B, during the step of patterning the silicon layer 201 to form the first waveguide 210 and the first to fifth waveguide sections 211, 212, 213, 214, 215, the pattern of the section of the third waveguide section is carried out in such a way that the second width WN is zero.

Figure 9C:
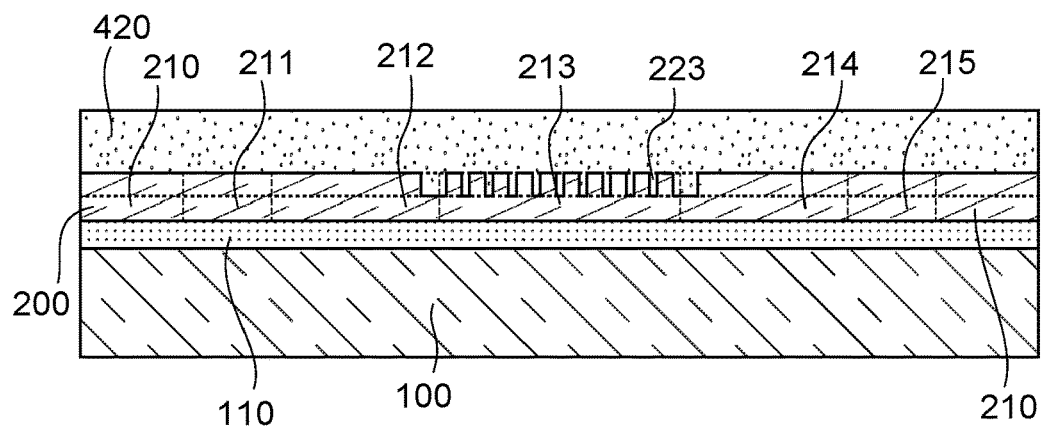
Figure 9D:
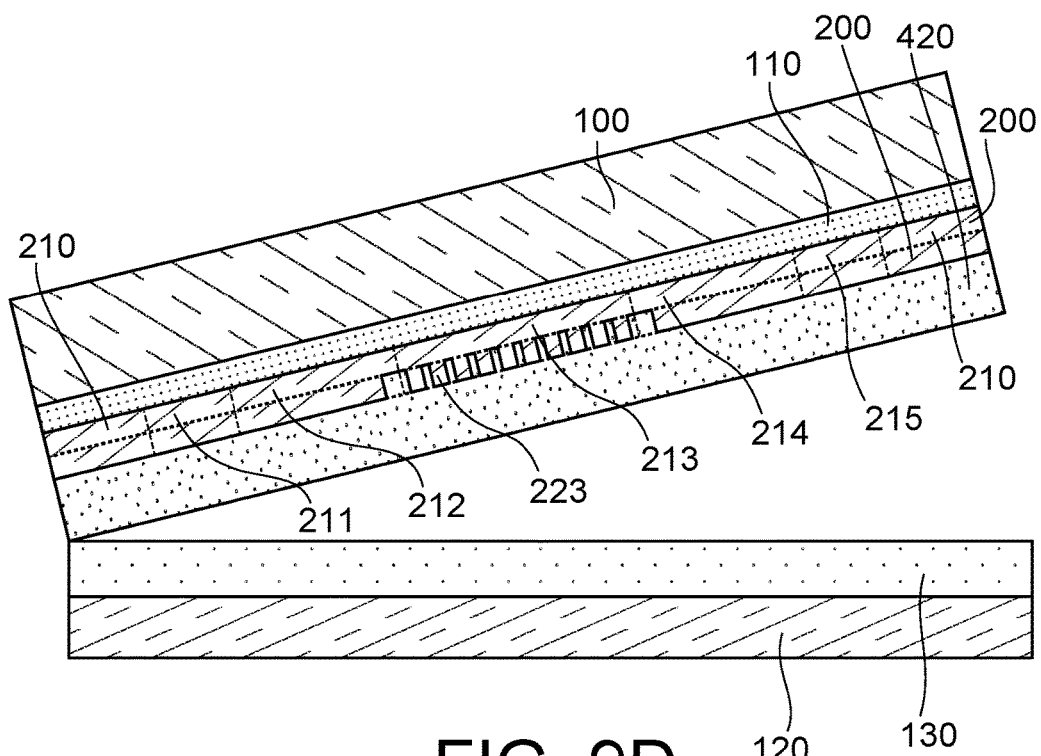
Figure 9E:
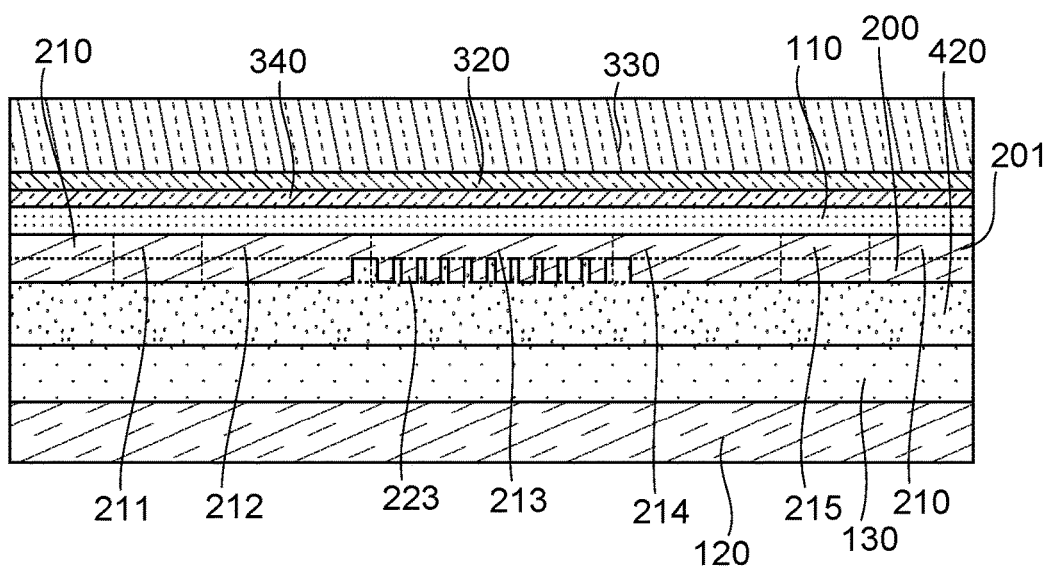

It will thus be noted, as illustrated in FIG. 9A, that the step of providing a substrate 100 is identical and that the steps that follow the step of patterning the silicon layer 201 to form the first waveguide 210 and the first to fifth waveguide sections 211, 212, 213, 214, 215, have, as single difference, as illustrated in FIGS. 9C to 9E, the shape of the feedback structure which is a Bragg grating with vertical corrugations.

Figure 10A:
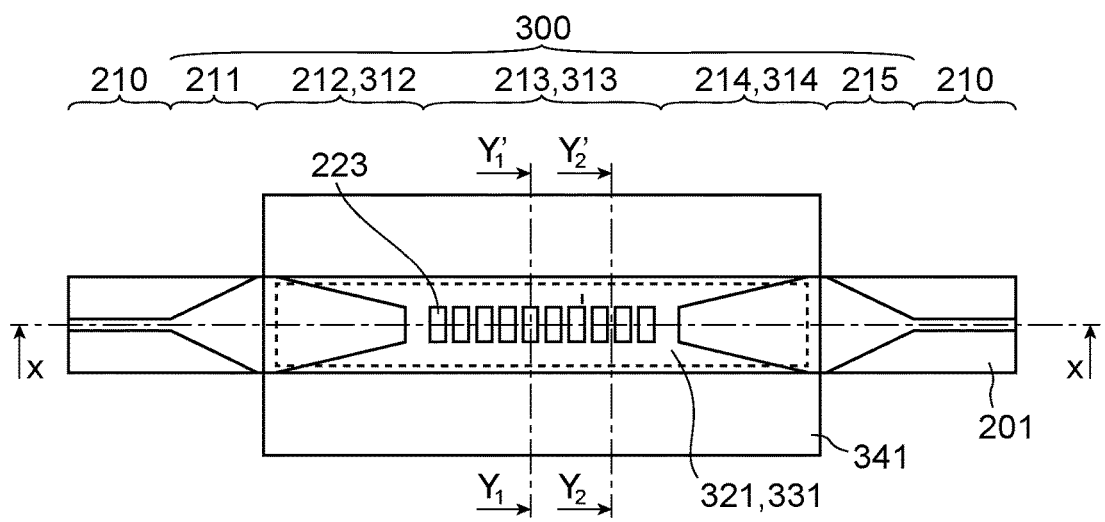
Figure 10B:
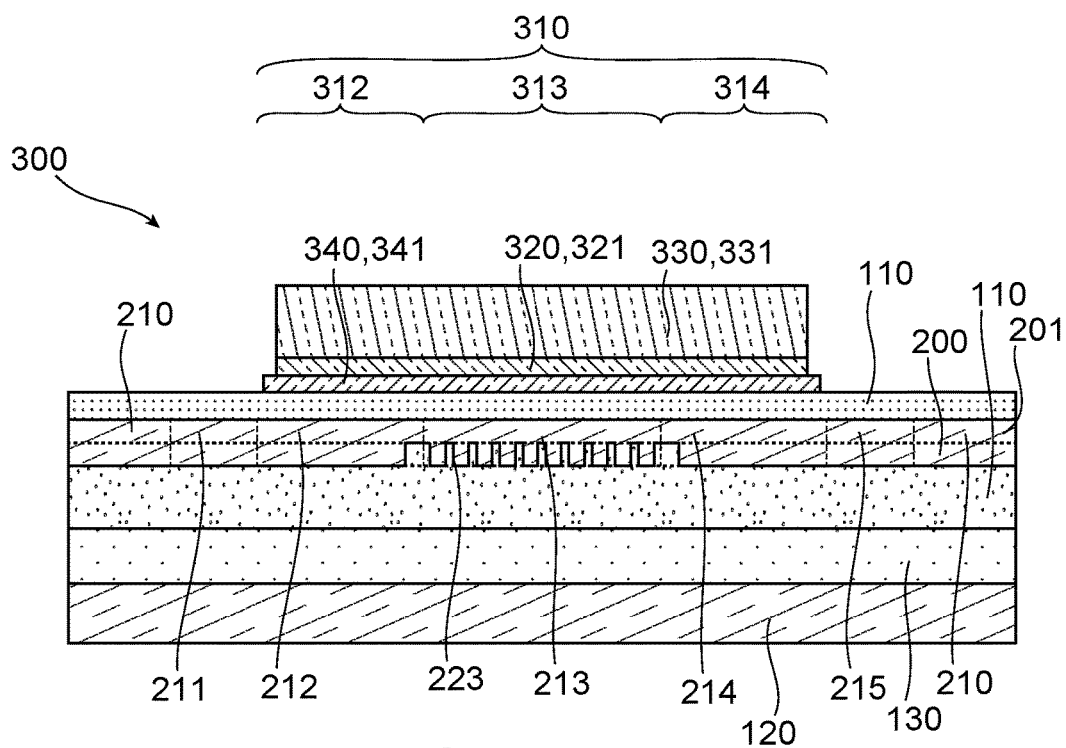

FIGS. 10A and 10B illustrate respectively a top view and a longitudinal sectional view along the plane XX' of a photonic device 1 according to a fourth embodiment of the invention in which the optical feedback structure is a Bragg grating 223 with vertical corrugations and in which the first semiconductor zone 331, the second semiconductor zone 341 and the gain medium 321 each have, over their respective lengths, a constant transversal section over the whole length of the gain structure 310. Such a photonic device 1 differs from a photonic device according to the third embodiment by virtue of the shape of the gain structure 310.

It will be noted that the method for manufacturing a photonic device 1 according to this fourth embodiment of the invention differs from a photonic device 1 according to the third embodiment in that during the step of partial etching of the first, second and third semiconductor layers 340, 320, 330, the gain structure 310 extends longitudinally along an optical propagation axis of the optical device 1 and the first semiconductor zone 331, the second semiconductor zone 341 and the gain medium 321 have, over their respective lengths, a transversal section of constant width.

FIGS. 11A to 11D illustrate, by respectively a longitudinal sectional view along the plane XX' and three transversal sectional views along the planes Y1Y1', Y4Y4', Y5Y5', a photonic device 1 according to a fifth embodiment in which a capacitive type hybrid optical modulator 230 is provided. A photonic device 1 according to this fifth embodiment differs from a photonic device 1 according to the third embodiment in that the first waveguide 210 accommodates an optical modulator 230 of the capacitive type and a coupling grating 240 partially etched in the silicon layer 201. It will be noted that FIGS. 11A to 11D show the encapsulation layer 510 and the electrical contacts of the laser 300 and the capacitive modulator 230.

Thus it may be seen in FIG. 11A that the silicon layer 201 further comprises a doped silicon zone 232, in relation with a fourth semiconductor zone 231, and a coupling grating 240 to extract radiation at the output of the photonic device 1. The coupling grating is a grating with a two-dimensional pattern in the silicon layer 201.

The photonic device 1 further comprises the fourth semiconductor zone 231 which, formed in the first semiconductor layer 340 in which the first semiconductor zone 341 is also formed, is facing the doped silicon zone 232. The fourth semiconductor zone 231 is in contact with the second face of the first dielectric layer 110. In this way, the fourth semiconductor zone 231, the doped silicon zone 232 and the part of the dielectric layer 110 that separates them form together the capacitive type hybrid optical modulator 230.

The method for manufacturing a photonic device 1 according to this fourth embodiment differs from a manufacturing method according to the second in that:

during the patterning of the silicon layer 201, the coupling grating 240 accommodated in the first waveguide 210 and the part of the first waveguide 210 intended to form the doped silicon zone 232 of the capacitive modulator 230 are also formed, a step of localised doping of the silicon layer 201 is provided in order to form the doped silicon zone 232 of a type of conductivity opposite to the type of conductivity of the fourth semiconductor zone 231, and during the formation of the gain structure 310, the fourth semiconductor zone 231 is also formed facing the doped silicon zone 232 in order to form the capacitive modulator 230, and steps of encapsulation of the gain structure in one or more dielectric materials are provided to form the encapsulation layer 510 and formation of the metal contacts 531, 532, 533, 534.

Figure 11C:
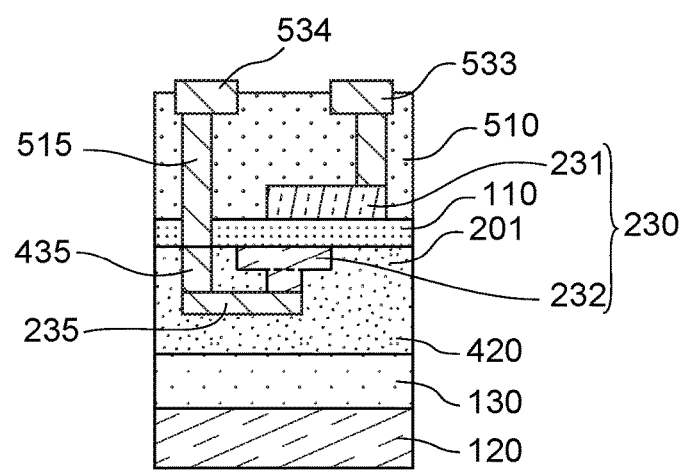
Figure 11D:
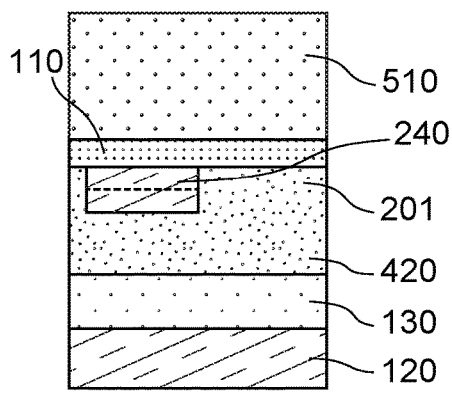

In FIG. 11C, the dielectric material 205 and parts made of dielectric materials of the intermediate layer 420 house a metal via 235 electrically connecting 232 a metal line 435 also housed in the dielectric material 205 and/or in the intermediate layer 420. An electrical via 515, accommodated in the encapsulation layer 510, and traversing the first dielectric layer 110, is in electrical contact with the metal line 435, thereby making it possible to provide the electrical contacts 534, 533 of the active components accommodated in the first waveguide 210, on the outside face of the encapsulation layer.

In FIG. 11B it may be seen that the first electrical contact 531 is constituted of a metal contact in contact with the surface of the first semiconductor zone 331 and suited to form therewith an Ohmic contact. The lateral metal contact of the first electrical contact 531 ends up in a second face of the encapsulation layer 510 which is opposite to the first dielectric layer 110. The second electrical contact 532 comprises a metal contact to contact the second semiconductor zone 341 and suited to form an Ohmic contact with the latter. The second electrical contact 532 further comprises a metal via in contact with the metal contact and traversing the encapsulation layer 510 while emerging on the second face of the encapsulation layer 510.

Figure 12A:
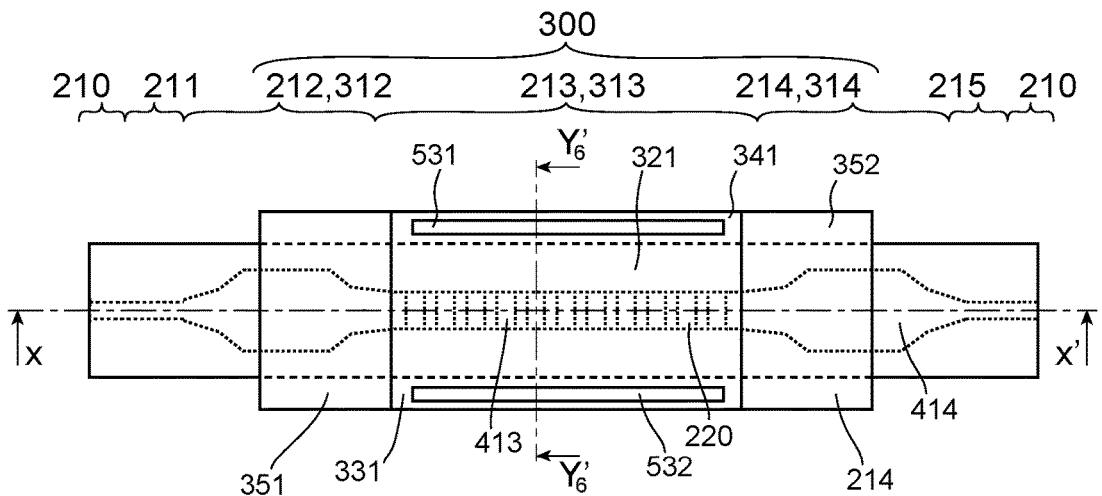
Figure 12B:
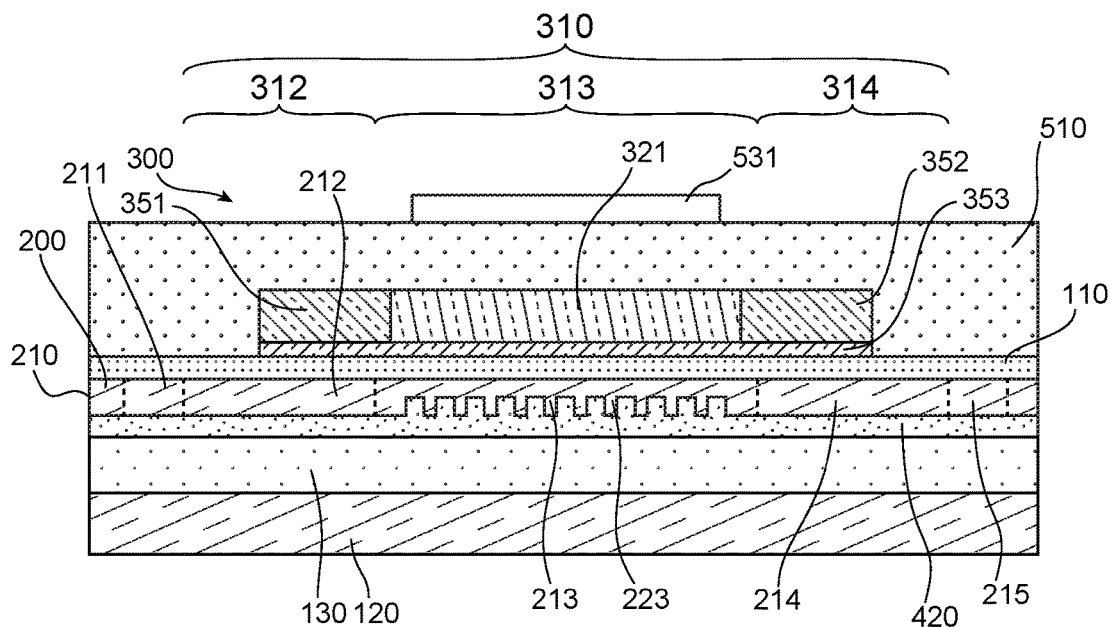
Figure 12C:
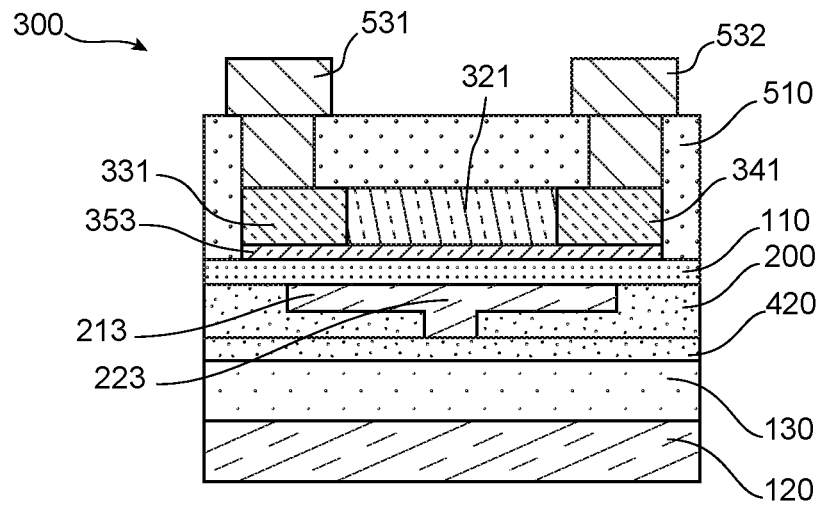

FIGS. 12A to 12C illustrate, by respectively a top view, a longitudinal sectional view along the plane XX' and a transversal sectional view along the plane Y6Y6', a photonic device according to a sixth embodiment of the invention in which the gain structure 310 is of the "lateral junction" type. A device according to this sixth embodiment differs from a phonic device 1 according to the third embodiment in that the gain structure 310 is a gain structure of the "lateral junction" type.

The gain structure 310 comprises, as illustrated in FIG. 12C, successively and along a transversal section of the waveguide hybrid 313 along the axis Y6Y6':
- a first semiconductor zone 341 of a first type of conductivity,
- a gain medium 321 comprising, for example, at least one layer of quantum wells, or quantum dots,
- a third semiconductor zone 331 of a second type of conductivity opposite to the first type of conductivity of the semiconductor zone 341.

The gain structure 310 further comprises, as illustrated in FIGS. 12A to 12C, a first and a second coupling zone 351, 352 arranged on either side of the first, second and third semiconductor zones 341, 331 along the direction of propagation of light, and a semiconductor layer 353, also not intentionally doped, being interposed between the first dielectric layer and the remainder of the gain structure 310. The first and the second coupling zones 351, 352 thereby each corresponds to one end of the gain structure 310 through which the first and the second optical transition zones 312, 314 enable an adiabatic transmission of the optic mode between the laser hybrid waveguide 313 and respectively the first and the fifth waveguide sections 211, 215.

The method for manufacturing a photonic device according to this sixth embodiment of the invention differs from the manufacturing method according to the first embodiment of the invention in that:
- during the step of forming the gain structure 310, the gain structure is a "lateral junction" structure.

Figure 13:
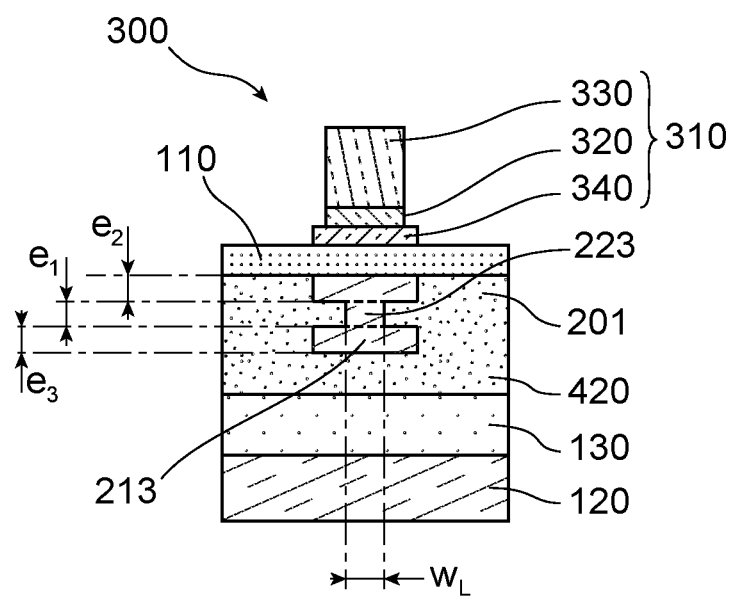
FIG. 13 illustrates a transversal sectional view at the level of a third waveguide section of a photonic device according to a fifth embodiment in which the optical guiding level comprises a third thickness part of a third waveguide section.

FIG. 13 illustrates a transversal sectional view of a photonic device 1 according to a sixth embodiment in which the first waveguide 210, and the set of the first to fifth waveguide sections 211, 212, 213, 214, 215, comprises a third thickness part e3.

Such a photonic device 1 differs from a photonic device according to the first embodiment in that each of the first waveguide 210 and the first to fifth waveguide sections 211, 212, 213, 214, 215 includes a third thickness part in contact with the intermediate layer 420.

Such a third thickness part may, for example, make it possible that the first waveguide accommodates electronic components.

In this sixth embodiment, the first part e1 of the thickness of the third waveguide section 213 is arranged between the second part e2 of the thickness of the third waveguide section 213, which is in contact with the first dielectric layer 110, and the third part of the thickness of the third waveguide section 213, which is in contact with the intermediate layer 420.

It will be noted that this configuration of the third waveguide section 213 is also shared by the first waveguide 210 and by the first, second, fourth and fifth waveguide sections 211, 212, 214, 215 which have their respective ridges arranged between the base and the third part e3 of their thickness.

A method for forming a photonic device 1 according to this sixth embodiment differs from a manufacturing method according to the first embodiment in that instead of the step of patterning the silicon layer 201 to form the first waveguide 210 and the first to fifth waveguide sections 211, 212, 213, 214, 215 distinct from the first waveguide 210, the following steps are provided:
- patterning the silicon layer 201 to form a first and second part e1, e2 of the thickness of the first waveguide 210 and the first to fifth waveguide sections 211, 212, 213, 214, 215 distinct from the first waveguide 210,
- forming an additional silicon layer in contact of the first thickness part of the first waveguide 210 and the first to fifth waveguide sections 211, 212, 213, 214, 215,
- patterning the additional silicon layer to form the third thickness part e3 of the first waveguide 210 and the first to fifth waveguide sections 211, 212, 213, 214, 215.

Obviously, during the step of burying the first waveguide 210 and the first to fifth sections of the first waveguide 211, 212, 213, 214, 215, the third thickness part e3 of the first waveguide 210 is buried in said dielectric filling material 205.

In accordance with this sixth embodiment, the step of forming in the silicon layer the first thickness part e1 of the first waveguide 210 and the first to fifth sections 211, 212, 213, 214, 215 may include the following sub-steps:
- burying the second thickness part e2 of the first waveguide 210 and the first to fifth waveguide sections 211, 212, 213, 214, 215, by the dielectric filling material 205 and planarization of said dielectric material 205,
- forming the additional silicon layer in contact with the second thickness part e2 of the first waveguide 210 and the first to fifth waveguide sections 211, 212, 213, 214, 215,
- patterning the additional silicon layer to form the first thickness part e1 of the first waveguide 210 and the first to fifth waveguide sections 211, 212, 213, 214, 215.

Said formation of the additional silicon layer may be either a sub-step of depositing said additional silicon layer or a sub-step of transferring such an additional silicon layer.

Obviously, if a photonic device 1 according to this sixth embodiment has a configuration in accordance with the first embodiment except for the presence of the third thickness part e3 of the first waveguide 210 and the first to fifth waveguide sections 211, 212, 213, 214, 215, such a configuration of a first waveguide 210 and of first to fifth waveguide sections 211, 212, 213, 214, 215 is also compatible with the photonic devices 1 according to the second to the fifth embodiments.

The invention claimed is:

1. A photonic device comprising:
a support,
an intermediate layer in contact with the support comprising at least one dielectric material,
a first waveguide,
a first waveguide section, a second waveguide section, a third waveguide section, a fourth waveguide section and a fifth waveguide section distinct from the first waveguide, the first waveguide section, the second waveguide section, the third waveguide section, the fourth waveguide section and the fifth waveguide section succeeding each other while being optically connected two by two, and being optically connected to the first waveguide by at least one of the first waveguide section and of the fifth waveguide section,
a dielectric filling material, to form with the first waveguide, the first waveguide section, the second waveguide section, the third waveguide section, the fourth waveguide section and the fifth waveguide section a wave guiding level of the photonic device, the optical guiding level including a first face through which it is in contact with the intermediate layer and a second face opposite to the first face,
a first dielectric layer comprising a dielectric material, the first dielectric layer covering the optical guiding level on its second face, a gain structure in contact with the first dielectric layer and comprising at least one gain medium capable of emitting light, the gain structure having a central portion facing the third waveguide section and, a first end and a second end facing second waveguide section and fourth waveguide section, thus, the central portion of the gain structure forms with the third waveguide section a laser hybrid waveguide, wherein the second waveguide section and the first end of the gain structure forming a first zone of optical transition of an optic mode between the laser hybrid waveguide and the first waveguide section, and wherein the fourth waveguide section and the second end of the gain structure forming a second zone of optical transition of an optic mode between the laser hybrid waveguide and the fifth waveguide section, wherein the third waveguide section is in contact with the intermediate layer and includes a pattern arranged uniquely in a first part of its thickness, said pattern forming a distributed Bragg grating under the gain structure to form a feedback structure and a resonant cavity including at least one part of the gain medium so doing so as to form a laser optically connected to the first waveguide by at least one of the first waveguide section and the fifth waveguide section, wherein the second waveguide section and fourth waveguide section are in contact with the intermediate layer on a part of the intermediate layer which is constituted uniquely of dielectric materials, wherein the third waveguide section includes at least one second part of its thickness that separates the first dielectric layer and the first part of the thickness of the third waveguide section.

2. The photonic device according to claim 1, wherein the first part of the thickness of the third waveguide section is in contact with the intermediate layer.

3. The photonic device according to claim 1, wherein the third waveguide section includes at least one third part of its thickness, said third thickness part being in contact with the intermediate layer.

4. The photonic device according to claim 1, wherein the thickness of the first dielectric layer is less than or equal to 100 nm.

5. The photonic device according to claim 4, wherein the thickness of the first dielectric layer is less than 70 nm.

6. The photonic device according to claim 1, wherein the third waveguide section extends longitudinally along an optical propagation axis of the optical device and wherein the pattern of the third waveguide section consists in an alternation between a transversal section of a first width and a transversal section of a second width different from the first width.

7. The photonic device according to claim 6, wherein the second width is of zero value.

8. The photonic device according to claim 1, wherein the gain structure) extends longitudinally along an optical propagation axis of the optical device (1), and wherein each of the first end of the gain structure and of the second end of the gain structure has, over at least one part of its thickness and along a longitudinal direction moving away from the central portion, a transversal section of decreasing width.

9. The photonic device according to claim 1, wherein the gain structure extends longitudinally along an optical propagation axis of the optical device and comprises a first semiconductor zone, a second semiconductor zone and the gain medium, and wherein, for each of the first end of the gain structure, the second end of the gain structure, the first semiconductor zone, the second semiconductor zone and the gain medium have, over their respective lengths, a transversal section of constant width.

10. The photonic device according to claim 1, wherein the waveguide accommodates at least one optical and/or electronic component.

11. The photonic device according to claim 10, wherein the optical component is chosen from the group comprising PN junction silicon optical modulators, hybrid III-V semiconductor on silicon modulators, surface coupling gratings, fibre couplers through the edge of the device, optical filters, wavelength multiplexers and demultiplexers, photodetectors of which germanium on silicon photodetectors and III-V semiconductor on silicon photodetectors form part.

12. The photonic device according to claim 11, in which the component accommodated by the waveguide is a hybrid III-V semiconductor on silicon modulator, said modulator being a capacitive modulator.

13. A method for manufacturing a photonic device comprising at least one silicon waveguide and a laser including a gain medium capable of emitting light, the method comprising the following steps:

providing a substrate associated with at least one silicon layer on a first dielectric layer, forming, at least in part in the silicon layer, a first waveguide, a first waveguide section, a second waveguide section, a third waveguide section, a fourth waveguide section and a fifth waveguide section, the first waveguide section, the second waveguide section, the third waveguide section, the fourth waveguide section and the fifth waveguide section being distinct from the first waveguide, succeeding each other optically connected two by two, and being optically connected to the first waveguide by at least one of the first waveguide section and the fifth waveguide section, the third waveguide section including a pattern arranged uniquely over a first part of its thickness, said pattern forming a Bragg grating, burying the first waveguide, the first waveguide section, the second waveguide section, the third waveguide section, the fourth waveguide section and the fifth waveguide section by at least one dielectric filling material and planarization of said dielectric filling material in order to form an optical guiding level including the first waveguide, the first waveguide section, the second waveguide section, the third waveguide section, the fourth waveguide section, the fifth waveguide section and an intermediate layer in contact with said optical guiding level, the third waveguide section being in contact with the intermediate layer, the second waveguide section and fourth waveguide section being in contact with the intermediate layer on a part of the intermediate layer which is constituted uniquely of dielectric materials, a substrate/first dielectric layer/optical guiding level/intermediate layer assembly thereby being formed, providing a support, assembling the substrate/first dielectric layer/optical guiding level/intermediate layer assembly on the support, the assembly being carried out by bonding of the intermediate layer on the support, removal of the substrate, forming a gain structure comprising at least a gain medium, the gain structure being formed in contact with the first dielectric layer while having a central portion of the gain structure facing the third waveguide section and a first end and a second end facing respectively the second waveguide section and the fourth waveguide section, thus, the central portion of the gain structure forms with the third waveguide section a laser hybrid waveguide, the second waveguide section and the first ends of the gain structure forming a first zone of optical transition of an optic mode between the laser hybrid waveguide and the first waveguide section, and the fourth waveguide section, and the second end of the gain structure forming a second zone of optical transition of an optic mode between the laser hybrid waveguide and the fifth waveguide section, the photonic device thereby being formed, during said formation of the structure, the first part of the thickness of the third waveguide section over which is arranged the pattern being separated from the first dielectric layer by at least one second part of the thickness of the third waveguide section.

14. The method for manufacturing a photonic device according to claim 13, wherein the step of forming, at least in part in the silicon layer, the first waveguide, the first waveguide section, the second waveguide section, the third waveguide section, the fourth waveguide section and the fifth waveguide section includes the following sub-steps:

patterning the layer silicon to form a second thickness part of the waveguide, the first waveguide section, the second waveguide section, the third waveguide section, the fourth waveguide section and the fifth waveguide section, forming from an additional silicon layer a first thickness part of the waveguide, first waveguide section, the second waveguide section, the third waveguide section, the fourth waveguide section and the fifth waveguide section.

15. The method for manufacturing a photonic device according to claim 13, wherein a step of thinning the first dielectric layer is further provided between the steps of removal of the substrate and of forming the gain structure.

16. The method for manufacturing a photonic device according to claim 13, wherein after the step of thinning the first dielectric layer, the first dielectric layer has a thickness less than or equal to 100 nm.

17. The method for manufacturing a photonic device according to claim 13, wherein during the step of forming the gain structure, the gain structure extends longitudinally along an optical propagation axis of the optical device and the first end and the second end of the gain structure have, over at least one part of their thickness and along a longitudinal direction moving away from the central portion, a transversal section of decreasing width.

18. The method for manufacturing a photonic device according to claim 13, wherein during the step of forming the gain structure, the gain structure extends longitudinally along an optical propagation axis of the optical device and comprises a first semiconductor zone, a second semiconductor zone and the gain medium, and wherein, for each of the first end and the second end of the gain structure, the first semiconductor zone, the second semiconductor zone and the gain medium have, over their respective lengths, a transversal section of constant width.

* * * * *

UNITED STATES PATENT AND TRADEMARK OFFICE
CERTIFICATE OF CORRECTION

PATENT NO. : 10,476,231 B2
APPLICATION NO. : 16/291102
DATED : November 12, 2019
INVENTOR(S) : Sylvie Menezo et al.

Page 1 of 1

It is certified that error appears in the above-identified patent and that said Letters Patent is hereby corrected as shown below:

In the Specification

Column 12, Line 53, delete "501" and insert -- S0I --

Signed and Sealed this
Seventh Day of April, 2020

Andrei Iancu
*Director of the United States Patent and Trademark Office*